United States Patent
Song et al.

(10) Patent No.: US 11,847,850 B2
(45) Date of Patent: Dec. 19, 2023

(54) ARRAY SUBSTRATE, MANUFACTURING METHOD THEREOF, AND DISPLAY DEVICE

(71) Applicant: Wuhan China Star Optoelectronics Technology Co., Ltd., Hubei (CN)

(72) Inventors: Dewei Song, Hubei (CN); Fei Ai, Hubei (CN); Jiyue Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 254 days.

(21) Appl. No.: 17/598,517

(22) PCT Filed: Jul. 1, 2021

(86) PCT No.: PCT/CN2021/103981
§ 371 (c)(1),
(2) Date: Sep. 27, 2021

(87) PCT Pub. No.: WO2022/257205
PCT Pub. Date: Dec. 15, 2022

(65) Prior Publication Data
US 2023/0282021 A1    Sep. 7, 2023

(30) Foreign Application Priority Data
Jun. 7, 2021    (CN) .......................... 202110631657.8

(51) Int. Cl.
*G06V 40/13*    (2022.01)
*H01L 27/12*    (2006.01)

(52) U.S. Cl.
CPC ...... *G06V 40/1306* (2022.01); *G06V 40/1318* (2022.01); *H01L 27/127* (2013.01); *H01L 27/1222* (2013.01); *H01L 27/1288* (2013.01)

(58) Field of Classification Search
CPC ............ G06V 40/1306; G06V 40/1318; H01L 27/1222; H01L 27/127; H01L 27/1288
See application file for complete search history.

(56) References Cited

U.S. PATENT DOCUMENTS

| | | | |
|---|---|---|---|
| 2019/0252456 A1* | 8/2019 | Li | ..................... H01L 31/02164 |
| 2021/0042493 A1* | 2/2021 | Lius | ..................... G09G 3/2003 |
| 2021/0133418 A1 | 5/2021 | Liu | |
| 2023/0094760 A1* | 3/2023 | Ai | ..................... G02F 1/13312 349/42 |

FOREIGN PATENT DOCUMENTS

| | | |
|---|---|---|
| CN | 103474437 | 12/2013 |
| CN | 105373772 | 3/2016 |
| CN | 106328660 | 1/2017 |
| CN | 106815573 | 6/2017 |
| CN | 107316884 | 11/2017 |

(Continued)

*Primary Examiner* — Abhishek Sarma

(57) ABSTRACT

An array substrate, a manufacturing method thereof, and a display device are provided. The array substrate includes a substrate, a metal electrode layer, a first passivation layer, a first electrode layer, a photosensitive semiconductor layer, a second passivation layer, and a second electrode layer. The first electrode layer and the photosensitive semiconductor layer are both disposed on a surface of the first passivation layer away from the metal electrode layer.

20 Claims, 11 Drawing Sheets

(56) References Cited

FOREIGN PATENT DOCUMENTS

| | | |
|---|---|---|
| CN | 108664907 | 10/2018 |
| CN | 108828824 | 11/2018 |
| CN | 110427121 | 11/2019 |
| CN | 111368805 | 7/2020 |
| CN | 111781777 | 10/2020 |
| CN | 111968994 | 11/2020 |
| CN | 112666734 | 4/2021 |

* cited by examiner

ARRAY SUBSTRATE, MANUFACTURING METHOD THEREOF, AND DISPLAY DEVICE

RELATED APPLICATIONS

This application is a National Phase of PCT Patent Application No. PCT/CN2021/103981 having International filing date of Jul. 1, 2021, which claims the benefit of priority of Chinese Patent Application No. 202110631657.8 filed on Jun. 7, 2021. The contents of the above applications are all incorporated by reference as if fully set forth herein in their entirety.

FIELD AND BACKGROUND OF THE INVENTION

The present disclosure relates to the field of display technologies, and more particularly, to an array substrate, a manufacturing method thereof, and a display device.

Fingerprint recognition technologies have been widely used in small and medium-sized display screens. At present, the fingerprint recognition technologies can be divided into three types: a capacitive fingerprint recognition technology, an optical fingerprint recognition technology, and an ultrasonic fingerprint recognition technology. The optical fingerprint recognition technology uses principles of light refraction and reflection. When light irradiates a finger, it is reflected by the finger to a photosensitive sensor. Since valleys and ridges of a fingerprint reflect light differently, intensities of reflected light received by the photosensitive sensor from the valleys and ridges are different, and then optical signals are converted into electrical signals for fingerprint recognition. The optical fingerprint recognition technology has good stability, strong penetrating ability, and relatively low costs, so it has broad application prospects. However, at present, display screens equipped with optical fingerprint recognition function needs to go through multiple masking processes, so the display screens equipped with optical fingerprint recognition function have complicated processes and high costs.

Technical problem: based on this, an objective of the present disclosure is to provide an array substrate, a manufacturing method thereof, and a display device to simplify processes and to reduce manufacturing costs.

SUMMARY OF THE INVENTION

The present disclosure provides an array substrate, which has a fingerprint recognition area and includes: a substrate; a metal electrode layer disposed on one side of the substrate and including a first electrode; a first passivation layer covering one side of the metal electrode layer away from the substrate and defined with a first opening, wherein, the first opening is positioned in the fingerprint recognition area and is configured to expose the first electrode; a photosensitive semiconductor layer disposed on one surface of the first passivation layer away from the metal electrode layer, covering the first opening, and electrically connected to the first electrode; a first electrode layer disposed on one surface of the first passivation layer away from the metal electrode layer; a second passivation layer covering sides of the photosensitive semiconductor layer and the first electrode layer away from the first passivation layer and defined with a second opening configured to expose the photosensitive semiconductor layer; and a second electrode layer disposed on one side of the second passivation layer away from the substrate and including a second electrode, wherein, the second electrode extends into the second opening to be electrically connected to the photosensitive semiconductor layer.

In an embodiment, the first passivation layer is defined with first through-holes configured to expose the metal electrode layer, the first electrode layer includes a first bridging electrode, and the first bridging electrode extends into the first through-holes to be electrically connected to the metal electrode layer; and the second passivation layer is defined with second through-holes, the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

In an embodiment, the metal electrode layer includes a fingerprint recognition common electrode disposed in the fingerprint recognition area and spaced apart from the first electrode;
  the first through-holes include a first sub through-hole configured to expose the fingerprint recognition common electrode;
  the first bridging electrode includes a first sub-bridging electrode extending into the first sub through-hole to be electrically connected to the fingerprint recognition common electrode; and
  the second through-holes include a second sub through-hole corresponding to the first sub through-hole and configured to expose the first sub-bridging electrode, and the second electrode extends into the second sub through-hole to be electrically connected to the first sub-bridging electrode and to be further electrically connected to the fingerprint recognition common electrode by the first sub-bridging electrode.

In an embodiment, the array substrate includes a main display area adjacent to the fingerprint recognition area; the array substrate further includes a transistor layer disposed between the substrate and the metal electrode layer; the metal electrode layer includes a second bridging electrode disposed in the main display area and electrically connected to the transistor layer; the first through-holes include a third sub through-hole defined in the main display area and configured to expose the second bridging electrode; the first bridging electrode includes a second sub-bridging electrode extending into the third sub through-hole to be electrically connected to the second bridging electrode; the second electrode layer includes a pixel electrode disposed in the main display area; and the second through-holes include a fourth sub through-hole corresponding to the third sub through-hole, and the pixel electrode extends into the fourth sub through-hole to be electrically connected to the second sub-bridging electrode and to be further electrically connected to the second bridging electrode and the transistor layer by the second sub-bridging electrode.

In an embodiment, the first passivation layer and the second passivation layer are defined with a third through-hole, the third through-hole penetrates through the first passivation layer and the second passivation layer and is configured to expose the metal electrode layer, and the second electrode layer extends into the third through-hole to be electrically connected to the metal electrode layer.

In an embodiment, the first electrode layer further includes a middle electrode disposed in the first opening and electrically connecting the first electrode to the photosensitive semiconductor layer, and an orthographic projection of the photosensitive semiconductor layer on a plane that the middle electrode is located overlaps the middle electrode.

In an embodiment, the array substrate includes a main display area adjacent to the fingerprint recognition area; the first electrode layer includes a display common electrode disposed on the surface of the first passivation layer away from the metal electrode layer and in the main display area; and the second electrode layer includes a pixel electrode disposed in the main display area and opposite to the display common electrode.

In an embodiment, the array substrate further includes a transistor layer disposed between the substrate and the metal electrode layer, wherein, the transistor layer includes a first transistor disposed in the fingerprint recognition area and electrically connected to the first electrode, and the first electrode, the photosensitive semiconductor layer, and the second electrode correspond to the first transistor.

In an embodiment, the first electrode layer includes a fingerprint recognition capacitor plate disposed in the fingerprint recognition area, and the second electrode is opposite to the fingerprint recognition capacitor plate.

The present disclosure further provides a manufacturing method of an array substrate. The method includes following steps: providing a substrate including a first area; disposing a metal electrode layer on one side of the substrate, wherein, the metal electrode layer includes a first electrode; disposing a first passivation layer on one side of the metal electrode layer away from the substrate, wherein, the first passivation layer covers the metal electrode layer; defining a first opening in the first passivation layer, wherein, the first opening is in the first area and configured to expose the first electrode; disposing a first electrode layer and a photosensitive semiconductor layer on one surface of the first passivation layer away from the metal electrode layer, wherein, the photosensitive semiconductor layer covers the first opening and is electrically connected to the first electrode; disposing a second passivation layer on sides of the photosensitive semiconductor layer and the first electrode layer away from the first passivation layer, wherein, the second passivation layer covers the photosensitive semiconductor layer and the first electrode layer; defining a second opening in the second passivation layer, wherein, the second opening is configured to expose the photosensitive semiconductor layer; and disposing a second electrode layer on one side of the second passivation layer away from the substrate, wherein, the second electrode layer includes a second electrode extending into the second opening to be electrically connected to the photosensitive semiconductor layer.

In an embodiment, the step of defining the first opening in the first passivation layer includes defining first through-holes in the first passivation layer, wherein, the first through-holes are configured to expose the metal electrode layer;

the step of disposing the first electrode layer and the photosensitive semiconductor layer on the surface of the first passivation layer away from the metal electrode layer includes disposing a first bridging electrode, wherein, the first bridging electrode extends into the first through-holes to be electrically connected to the metal electrode layer; and the step of defining the second opening in the second passivation layer includes defining second through-holes in the second passivation layer, wherein, the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

In an embodiment, the step of disposing the first electrode layer and the photosensitive semiconductor layer on the surface of the first passivation layer away from the metal electrode layer is finished by a mask process using a grayscale mask or a halftone mask; and the first electrode layer further includes a middle electrode disposed in the first opening and electrically connecting the first electrode to the photosensitive semiconductor layer, and an orthographic projection of the photosensitive semiconductor layer on a plane that the middle electrode is located overlaps the middle electrode.

The present disclosure further provides a display device, which includes an array substrate having a fingerprint recognition area, wherein, the array substrate includes:

a substrate;

a metal electrode layer disposed on one side of the substrate and including a first electrode;

a first passivation layer covering one side of the metal electrode layer away from the substrate and defined with a first opening, wherein, the first opening is positioned in the fingerprint recognition area and is configured to expose the first electrode;

a photosensitive semiconductor layer disposed on one surface of the first passivation layer away from the metal electrode layer, covering the first opening, and electrically connected to the first electrode;

a first electrode layer disposed on one surface of the first passivation layer away from the metal electrode layer;

a second passivation layer covering sides of the photosensitive semiconductor layer and the first electrode layer away from the first passivation layer and defined with a second opening configured to expose the photosensitive semiconductor layer; and a second electrode layer disposed on one side of the second passivation layer away from the substrate and including a second electrode, wherein, the second electrode extends into the second opening to be electrically connected to the photosensitive semiconductor layer.

In an embodiment, the first passivation layer is defined with first through-holes configured to expose the metal electrode layer, the first electrode layer includes a first bridging electrode, and the first bridging electrode extends into the first through-holes to be electrically connected to the metal electrode layer; and the second passivation layer is defined with second through-holes, the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

In an embodiment, the metal electrode layer includes a fingerprint recognition common electrode disposed in the fingerprint recognition area and spaced apart from the first electrode;

the first through-holes include a first sub through-hole configured to expose the fingerprint recognition common electrode;

the first bridging electrode includes a first sub-bridging electrode extending into the first sub through-hole to be electrically connected to the fingerprint recognition common electrode; and the second through-holes include a second sub through-hole corresponding to the first sub through-hole and configured to expose the first sub-bridging electrode, and the second electrode extends into the second sub through-hole to be electrically connected to the first sub-bridging electrode and to be further electrically connected to the fingerprint recognition common electrode by the first sub-bridging electrode.

In an embodiment, the first passivation layer and the second passivation layer are defined with a third through-hole, the third through-hole penetrates through the first passivation layer and the second passivation layer and is configured to expose the metal electrode layer, and the second electrode layer extends into the third through-hole to be electrically connected to the metal electrode layer.

In an embodiment, the first electrode layer further includes a middle electrode disposed in the first opening and electrically connecting the first electrode to the photosensitive semiconductor layer, and an orthographic projection of the photosensitive semiconductor layer on a plane that the middle electrode is located overlaps the middle electrode.

In an embodiment, the array substrate includes a main display area adjacent to the fingerprint recognition area; the first electrode layer includes a display common electrode disposed on the surface of the first passivation layer away from the metal electrode layer and in the main display area; and the second electrode layer includes a pixel electrode disposed in the main display area and opposite to the display common electrode.

In an embodiment, the array substrate further includes a transistor layer disposed between the substrate and the metal electrode layer, wherein, the transistor layer includes a first transistor disposed in the fingerprint recognition area and electrically connected to the first electrode, and the first electrode, the photosensitive semiconductor layer, and the second electrode correspond to the first transistor.

In an embodiment, the first electrode layer includes a fingerprint recognition capacitor plate disposed in the fingerprint recognition area, and the second electrode is opposite to the fingerprint recognition capacitor plate.

Beneficial effect: the present disclosure provides the array substrate, the manufacturing method thereof, and the display device. The array substrate has the fingerprint recognition area. The array substrate includes the substrate, the metal electrode layer, the first passivation layer, the first electrode layer, the photosensitive semiconductor layer, the second passivation layer, and the second electrode layer. The metal electrode layer is disposed on one side of the substrate and includes the first electrode. The first passivation layer covers one side of the metal electrode layer away from the substrate and is defined with the first opening, and the first opening is positioned in the fingerprint recognition area and is configured to expose the first electrode. The photosensitive semiconductor layer is disposed on one surface of the first passivation layer away from the metal electrode layer, covers the first opening, and is electrically connected to the first electrode. The first electrode layer is disposed on one surface of the first passivation layer away from the metal electrode layer. The second passivation layer covers sides of the photosensitive semiconductor layer and the first electrode layer away from the first passivation layer and is defined with the second opening, and the second opening is configured to expose the photosensitive semiconductor layer. The second electrode layer is disposed on one side of the second passivation layer away from the substrate and includes the second electrode, and the second electrode extends into the second opening to be electrically connected to the photosensitive semiconductor layer.

The array substrate, the manufacturing method thereof, and the display device can omit a passivation layer between the first electrode layer and the photosensitive semiconductor layer in current technology by disposing both the first electrode layer and the photosensitive semiconductor layer on the surface of the first passivation layer away from the metal electrode layer, thereby simplifying a structure and processes thereof.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. Obviously, the accompanying figures described below are only part of the embodiments of the present disclosure, from which those skilled in the art can derive further figures without making any inventive efforts.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all embodiments. Based on the embodiments in the present disclosure, all other embodiments obtained by those skilled in the art without creative efforts are within the scope of the present disclosure.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature.

Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

Figure 1:
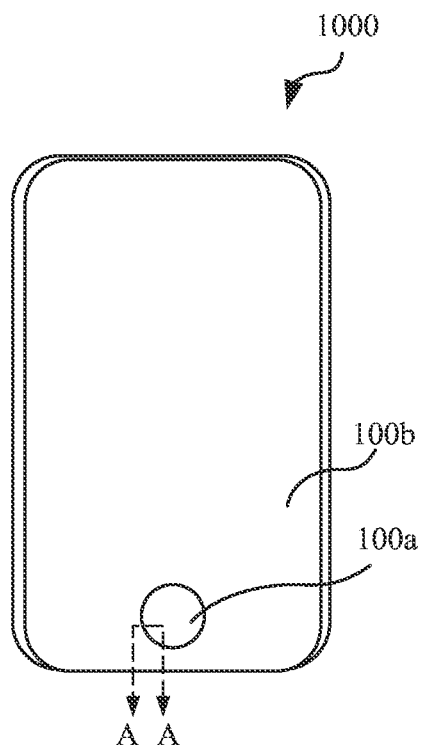
FIG. 1 is a schematic planar diagram of a display device according to an embodiment of the present disclosure.
Figure 2:
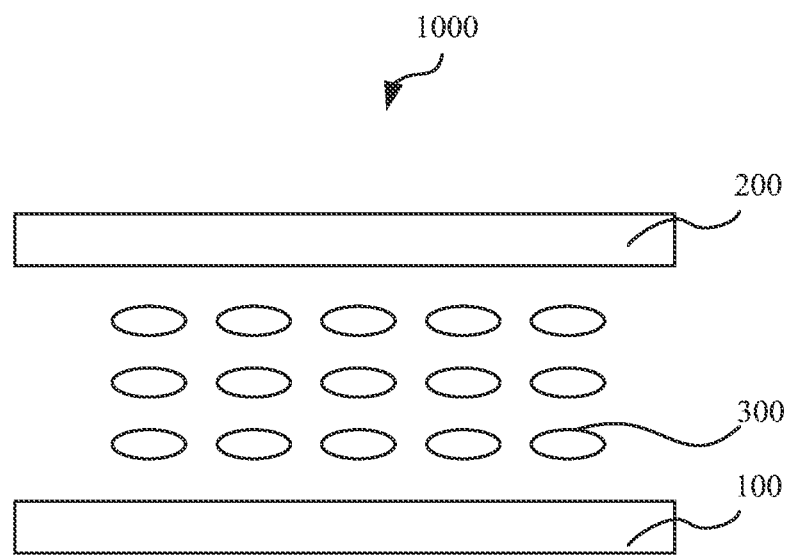
FIG. 2 is a schematic structural diagram of the display device according to an embodiment of the present disclosure.

Referring to FIGS. 1 and 2, FIG. 1 is a schematic planar diagram of a display device according to an embodiment of the present disclosure, and FIG. 2 is a schematic structural diagram of the display device according to an embodiment of the present disclosure. The present disclosure provides a display device 1000 having a fingerprint recognition function. In an embodiment, the display device 1000 also has a touch control function.

The display device 1000 may be a mobile phone, a tablet computer, a notebook, a game console, a digital camera, a car navigation system, an automatic teller machine, etc.

The display device 1000 of the present disclosure is a liquid crystal display device. The present disclosure does not limit a display type of the display device 1000, which may be a vertical electric field type display device, such as a twisted nematic (TN) type display device or a multi-domain vertical alignment (MVA) type display device, or it may also be a horizontal electric field type display device, such as a fringe field switching (FFS) type display device or an in-plane switching (IPS) type display device.

The display device 1000 includes an array substrate 100, an opposite substrate 200, and a liquid crystal layer 300. The array substrate 100 and the opposite substrate 200 are disposed opposite to each other. The liquid crystal layer is disposed between the array substrate 100 and the opposite substrate 200. In this embodiment, the opposite substrate 200 is a color filter substrate. In other embodiments of the present disclosure, the array substrate 100 may be a color filter on array (COA) type array substrate, and at this time, the opposite substrate 200 does not include a color filter layer. It can be understood that the display device 1000 may also include other display components that are not mentioned, such as a backlight module, a glue frame, bezels, upper and lower polarizers, etc.

Figure 3A:
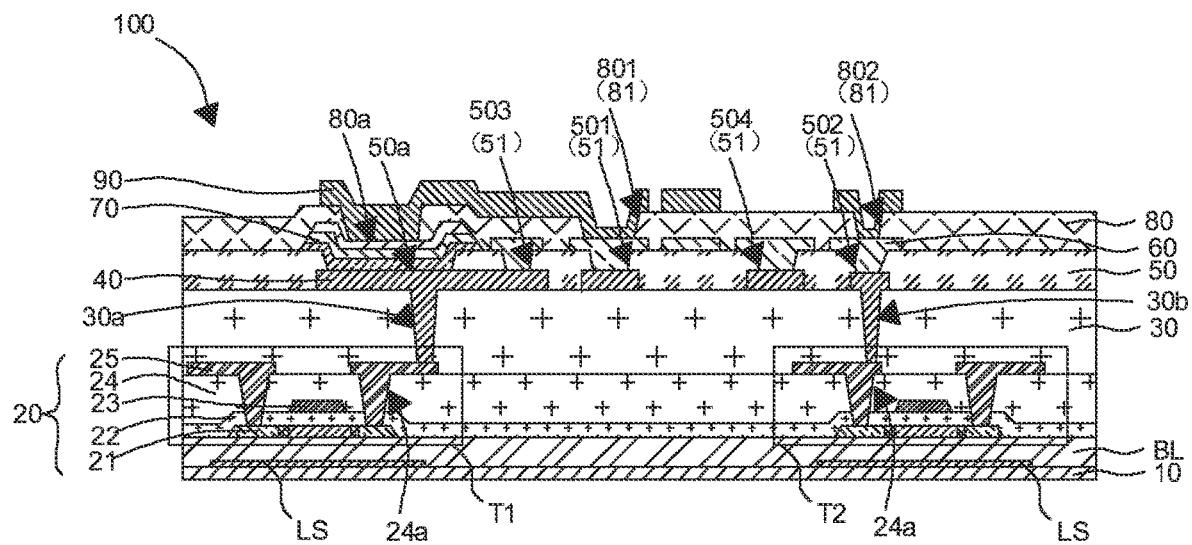
FIGS. 3(a) and 3(b) are schematic cross-sectional diagrams of an array substrate of the display device along line A-A in FIG. 1.
Figure 3B:
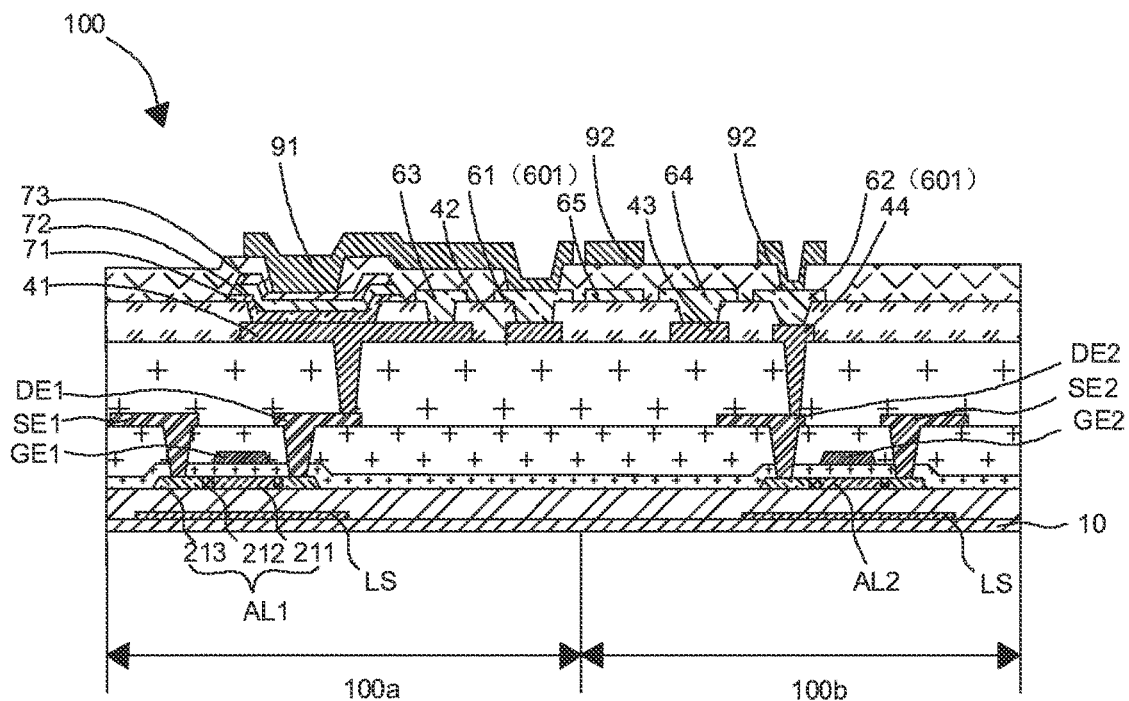

Referring to FIGS. 3(a) and 3(b), FIGS. 3(a) and 3(b) are schematic cross-sectional diagrams of the array substrate of the display device along line A-A in FIG. 1. The array substrate 100 includes a fingerprint recognition area 100a and a main display area 100b. The main display area 100b is adjacent to the fingerprint recognition area 100a. In an embodiment, the main display area 100b surrounds the fingerprint recognition area 100a. The fingerprint recognition area 100a is used for fingerprint recognition. The fingerprint recognition area 100a can also for display. The main display area 100b and the fingerprint recognition area 100a cooperate with each other to display a complete picture.

The array substrate 100 includes a substrate 10, a transistor layer 20, a planarization layer 30, a metal electrode layer 40, a first passivation layer 50, a first electrode layer 60, a photosensitive semiconductor layer 70, a second passivation layer 80, and a second electrode layer 90. The transistor layer 20, the planarization layer 30, the metal electrode layer 40, the first passivation layer 50, the first electrode layer 60, the photosensitive semiconductor layer 70, the second passivation layer 80, and the second electrode layer 90 are disposed on the substrate 10 in sequence.

The substrate 10 may be a glass substrate or a plastic substrate.

The transistor layer 20 is disposed on one side of the substrate 10 and is a driving layer of display components and fingerprint recognition function.

The transistor layer 20 includes a first transistor T1 and a second transistor T2, the first transistor T1 is located in the fingerprint recognition area 100a and is used as a switch element of a fingerprint recognition sensor, and the second transistor T2 is located in the main display area 100b and is used as a switch element of a display pixel. In this embodiment, the first transistor T1 and the second transistor T2 are both top-gate thin film transistors. Specifically, the transistor layer 20 includes an active layer 21, a gate insulating layer 22, a gate electrode metal layer 23, an interlayer insulating layer 24, and a source and drain electrode metal layer 25 stacked on the substrate 10 in sequence. Specifically, the active layer 21 is disposed on one side of the substrate 10 and includes a first channel part AL1 and a second channel part AL2. The first channel part AL1 and the second channel part AL2 are arranged on the side of the substrate 10, the first channel part AL1 is in the fingerprint recognition area 100a, and the second channel part AL2 is in the main display area 100b. Materials of the first channel part AL1 and the second channel part AL2 include low temperature polysilicon. Low temperature polysilicon is formed by depositing an amorphous silicon layer on the substrate 10 and using excimer laser annealing to transform the amorphous silicon layer into a polysilicon layer. Wherein, the first channel part AL1 includes a channel region 211 and two lightly doped regions 212 located on both sides of the channel region 211. The first channel part AL1 also includes two heavily doped regions 213. Each of the heavily doped regions 213 is located on one side of the lightly doped regions 212 away from the channel region 211. The lightly doped regions 212 and the heavily doped regions 213 may be N-type doped regions. In an embodiment, the lightly doped regions 212 are formed by doping phosphorus ions in a low temperature polysilicon material. The heavily doped regions 213 are formed by doping the phosphorus ions again under shielding of a first gate electrode GE1 after the first gate electrode GE1 is formed. A structure of the second channel part AL2 is same as that of the first channel part AL1, and will not be repeated herein.

The gate insulating layer 22 covers the active layer 21. The gate electrode metal layer 23 is disposed on one side of the gate insulating layer 22 away from the substrate 10. The gate electrode metal layer 23 includes the first gate electrode GE1 and a second gate electrode GE2. The first gate electrode GE1 and the second gate electrode GE2 are arranged on the side of the gate insulating layer 22 away from the substrate 10. The first gate electrode GE1 corresponds to the first channel part AL1, and the second gate electrode GE2 corresponds to the second channel part AL2. The interlayer insulating layer 24 covers the gate electrode metal layer 23. The source and drain electrode metal layer 25 is disposed on one side of the interlayer insulating layer 24 away from the gate electrode metal layer 23. The source and drain electrode metal layer 25 includes a first source electrode SE1, a first drain electrode DE1, a second source electrode SE2, and a second drain electrode DE2. The first source electrode SE1, the first drain electrode DE1, the second source electrode SE2, and the second drain electrode DE2 are arranged in sequence on the side of the interlayer insulating layer 24 away from the gate electrode metal layer 23. The first source electrode SE1 and the first drain electrode DE1 are disposed corresponding to both ends of the first channel part AL1 and are connected to the both ends of the first channel part AL1 by connecting holes 24a defined in the interlayer insulating layer 24. The second source electrode SE2 and the second drain electrode DE2 are disposed corresponding to both ends of the second channel part AL2 and are connected to the both ends of the second channel part AL2 by the connecting holes 24a defined in the interlayer insulating layer 24.

Wherein, the first transistor T1 includes the first channel part AL1, the first gate electrode GE1, the first source electrode SE1, and the first drain electrode DE1. The second transistor T2 includes the second channel part AL2, the second gate electrode GE2, the second source electrode SE2, and the second drain electrode DE2.

Materials of the gate electrode metal layer 23 and the source and drain electrode metal layer 25 may be tantalum (Ta), tungsten (W), molybdenum (Mo), aluminum (Al), titanium (Ti), or copper-niobium (CuNb) alloy, or may be laminates of copper (Cu) and molybdenum (Mo), laminates of copper (Cu) and molybdenum titanium (MoTi) alloy, laminates of copper (Cu) and titanium (Ti), laminates of aluminum (Al) and molybdenum (Mo), laminates of molybdenum (Mo) and tantalum (Ta), laminates of molybdenum (Mo) and tungsten (W), and laminates of molybdenum (Mo), aluminum (Al), and molybdenum (Mo). Materials of the gate insulating layer 22 and the interlayer insulating layer 24 may be silicon oxide, silicon nitride, silicon oxynitride, or laminates thereof.

It can be understood that a structure of transistors in the transistor layer 20 of the present disclosure is not limited, and it may be a top-gate thin film transistor, a bottom-gate thin film transistor, or a double-gate thin film transistor.

It can be understood that in an embodiment, a light shielding layer LS may also be disposed between the substrate 10 and the transistor layer 20 to shield light in the first channel part AL1 and the second channel part AL2. The light shielding layer LS is disposed corresponding to the first channel part AL1 and the second channel part AL2. A material of the light shielding layer LS may be a metal material, such as molybdenum (Mo) or aluminum (Al). One side of the light shielding layer LS adjacent to the active layer 21 is covered by a buffer layer BL. A material of the buffer layer BL may be silicon oxide, silicon nitride, silicon oxynitride, or laminates thereof.

The planarization layer 30 covers one side of the transistor layer 20 away from the interlayer insulating layer 24. The planarization layer 30 is defined with a plurality of vias. The vias are used to connect the metal electrode layer 40 to the transistor layer 20. Specifically, the vias include a first via 30a and a second via 30b. The first via 30a is located in the fingerprint recognition area 100a and is configured to expose the first drain electrode DE1 of the first transistor T1. The second via 30b is located in the main display area 100b and is configured to expose the second drain electrode DE2 of the second transistor T2. A material of the planarization layer 30 may be silicon oxide, silicon nitride, silicon oxynitride, or laminates thereof, or may be an organic material, such as acrylic resins or perfluoroalkoxy (PFA) resins.

The metal electrode layer 40 is disposed on one side of the planarization layer 30 away from the transistor layer 20. The metal electrode layer 40 includes a first electrode 41, a fingerprint recognition common electrode 42, a touch control wiring 43, and a second bridging electrode 44. In this embodiment, the first electrode 41, the fingerprint recognition common electrode 42, the touch control wiring 43, and the second bridging electrode 44 are spaced apart from each other on the side of the planarization layer 30 away from the transistor layer 20 and are insulated from each other. In other embodiments of the present disclosure, an arrangement thereof is not limited. Wherein, the first electrode 41 and the fingerprint recognition common electrode 42 are disposed in the fingerprint recognition area 100a. The first electrode 41 is electrically connected to the first drain electrode DE1 of the first transistor T1 by the first via 30a defined in the planarization layer 30. The touch control wiring 43 and the second bridging electrode 44 are located in the main display area 100b. The touch control wiring 43 transmits signals for a touch control module, and the second bridging electrode 44 is electrically connected to the second drain electrode DE2 of the second transistor T2 by the second via 30b defined in the planarization layer 30.

A material of the metal electrode layer 40 may be tantalum (Ta), tungsten (W), molybdenum (Mo), aluminum (Al), titanium (Ti), or copper-niobium (CuNb) alloy, or may be laminates of copper (Cu) and molybdenum (Mo), laminates of copper (Cu) and molybdenum titanium (MoTi) alloy, laminates of copper (Cu) and titanium (Ti), laminates of aluminum (Al) and molybdenum (Mo), laminates of molybdenum (Mo) and tantalum (Ta), laminates of molybdenum (Mo) and tungsten (W), and laminates of molybdenum (Mo), aluminum (Al), and molybdenum (Mo).

The first passivation layer 50 covers one side of the metal electrode layer 40 away from the planarization layer 30 and is defined with a first opening 50a, and the first opening 50a is positioned in the fingerprint recognition area 100a and is configured to expose the first electrode 41. The first passivation layer 50 are further defined with a plurality of first through-holes 51 having a consistent depth and formed in a same mask process, and the first through-holes 51 are configured to expose the metal electrode layer 40. Specifically, the first through-holes 51 include a first sub through-hole 501, a third sub through-hole 502, a fifth sub through-hole 503, and a sixth sub through-hole 504. The fifth sub through-hole 503, the first sub through-hole 501, the sixth sub through-hole 504, and the third sub through-hole 502 are arranged in sequence on the side of the metal electrode layer 40 away from the substrate 10. Wherein, the first sub through-hole 501 and the fifth sub through-hole 503 are located in the fingerprint recognition area 100a. The first sub through-hole 501 is configured to expose the fingerprint recognition common electrode 42. The fifth sub through-hole 503 is located between the first opening 50a and the first sub through-hole 501. The fifth sub through-hole 503 is configured to expose the first electrode 41. The third sub through-hole 502 and the sixth sub through-hole 504 are located in the main display area 100b. The third sub through-hole 502 is used to expose the second bridging electrode 44, and the sixth sub through-hole 504 is used to expose the touch control wiring 43.

The first electrode layer 60 is disposed on a surface of the first passivation layer 50 away from the metal electrode layer 40. The first electrode layer 60 includes a first bridging electrode 601, a fingerprint recognition capacitor plate 63, a touch control electrode 64, and a common electrode 65. Wherein, the first bridging electrode 601 includes a first sub-bridging electrode 61 and a second sub-bridging electrode 62. In this embodiment, the fingerprint recognition capacitor plate 63, the first sub-bridging electrode 61, the common electrode 65, the touch control electrode 64, and the second sub-bridging electrode 62 are arranged in sequence on the surface of the first passivation layer 50 away from the metal electrode layer 40. In the present disclosure, an arrangement thereof is not limited. The first sub-bridging electrode 61 and the fingerprint recognition capacitor plate 63 are located in the fingerprint recognition area 100a. The first sub-bridging electrode 61 extends into the first sub through-hole 501 to be electrically connected to the fingerprint recognition common electrode 42. The fingerprint recognition capacitor plate 63 is located between the photosensitive semiconductor layer 70 and the first sub-bridging electrode 61, and extends into the fifth sub through-hole 503 to be electrically connected to the first electrode 41. The second sub-bridging electrode 62, the touch control electrode 64, and the common electrode 65 are located in the main display area 100b. The second sub-bridging electrode 62 extends into the third sub through-hole 502 to be electrically connected to the second bridging electrode 44. The touch control electrode 64 is disposed corresponding to the touch control wiring 43, and extends into the sixth sub-through hole 504 to be electrically connected to the touch control wiring 43. The common electrode 65 is used to apply voltages to the display pixel, thereby controlling liquid crystals to deflect.

The photosensitive semiconductor layer 70 is disposed on the surface of the first passivation layer 50 away from the metal electrode layer 40. The photosensitive semiconductor layer 70 covers the first opening 50a and is electrically connected to the first electrode 41. The photosensitive semiconductor layer 70 is used as a photosensitive layer of the fingerprint recognition sensor to receive optical signals reflected by a fingerprint and to convert the optical signals to electrical signals. In an embodiment, the photosensitive semiconductor layer 70 includes a first amorphous silicon layer 71, a second amorphous silicon layer 72, and a third amorphous silicon layer 73 stacked in sequence on one side of the first electrode 41 away from the transistor layer 20. A material of the first amorphous silicon layer 71 includes N-type doped amorphous silicon, a material of the second amorphous silicon layer 72 includes intrinsic amorphous silicon, and a material of the third amorphous silicon layer 73 includes P-type doped amorphous silicon. In another embodiment, the photosensitive semiconductor layer 70 may only include the first amorphous silicon layer 71 and the second amorphous silicon layer 72 disposed in a stack, that is, intrinsic amorphous silicon and P-type doped amorphous silicon.

The second passivation layer 80 covers sides of the photosensitive semiconductor layer 70 and the first electrode layer 60 away from the first passivation layer 50 and is defined with a second opening 80a, and the second opening 80a is configured to expose the photosensitive semiconductor layer 70. The second passivation layer 80 is defined with a plurality of second through-holes 81. The second through-holes 81 correspond to the first through-holes 51, and are used to expose the first bridging electrode 601. Specifically, the second through-holes 81 include a second sub through-hole 801 and a fourth sub through-hole 802. The second sub through-hole 801 corresponds to the first sub through-hole 501 and is configured to expose the first sub-bridging electrode 61. The fourth sub through-hole 802 corresponds to the third sub through-hole 502 and is configured to expose the second sub-bridging electrode 62.

The second electrode layer 90 is disposed on one side of the second passivation layer 80 away from the substrate 10. The second electrode layer 90 extends into the second through-holes 81 to be electrically connected to the first bridging electrode 601 and to be further electrically connected to the metal electrode layer 40 by the first bridging electrode 601. The second electrode layer 90 includes a second electrode 91 and a pixel electrode 92. The pixel electrode 92 is disposed in the main display area 100b. A part of the pixel electrode 92 is disposed opposite to the common electrode 65 and is configured to cooperate with the common electrode 65 to control the liquid crystals to deflect. Another part of the pixel electrode 92 extends into the fourth sub through-hole 802 to be electrically connected to the second sub-bridging electrode 62 and to be further electrically connected to the second drain electrode DE2 by the second sub-bridging electrode 62 and the second bridging electrode 44. A part of the second electrode 91 extends into the second opening 80a to be electrically connected to the photosensitive semiconductor layer 70. Another part of the second electrode 91 extends into the second sub through-hole 801 to be electrically connected to the first sub-bridging electrode 61 and to be further electrically connected to the fingerprint recognition common electrode 42 by the first sub-bridging electrode 61. The second electrode 91 is further opposite to the fingerprint recognition capacitor plate 63. The second electrode 91 and the fingerprint recognition capacitor plate 63 together constitute a fingerprint recognition capacitor.

The fingerprint recognition sensor of the present disclosure includes the first electrode 41, the photosensitive semiconductor layer 70, and the second electrode 91. The first electrode 41 is used as a lower electrode of the fingerprint recognition sensor, the second electrode 91 is used as an upper electrode of the fingerprint recognition sensor, both of them and the photosensitive semiconductor layer 70 together constitute an amorphous silicon PIN diode. The amorphous silicon PIN diode has higher fingerprint recognition accuracy. In an embodiment, the first electrode 41, the photosensitive semiconductor layer 70, and the second electrode 91 are disposed corresponding to the first transistor T1. The first electrode 41, the photosensitive semiconductor layer 70, and the second electrode 91 may be disposed directly above the first transistor T1. Therefore, aperture ratio can be improved.

The present disclosure provides the array substrate and the display device. The array substrate has the fingerprint recognition area. The array substrate includes the substrate, the metal electrode layer, the first passivation layer, the first electrode layer, the photosensitive semiconductor layer, the second passivation layer, and the second electrode layer. The metal electrode layer is disposed on one side of the substrate and includes the first electrode. The first passivation layer covers one side of the metal electrode layer away from the substrate and is defined with the first opening, and the first opening is positioned in the fingerprint recognition area and is configured to expose the first electrode. The photosensitive semiconductor layer is disposed on the surface of the first passivation layer away from the metal electrode layer. The photosensitive semiconductor layer covers the first opening and is electrically connected to the first electrode. The first electrode layer is disposed on the surface of the first passivation layer away from the metal electrode layer. The second passivation layer covers the sides of the photosensitive semiconductor layer and the first electrode layer away from the first passivation layer and is defined with the second opening, and the second opening is configured to expose the photosensitive semiconductor layer. The second electrode layer is disposed on one side of the second passivation layer away from the substrate. The second electrode layer includes the second electrode, and the second electrode extends into the second opening to be electrically connected to the photosensitive semiconductor layer.

The array substrate and the display device of the present disclosure can omit a passivation layer between the first electrode layer and the photosensitive semiconductor layer in current technology by disposing both the first electrode layer and the photosensitive semiconductor layer on the surface of the first passivation layer away from the metal electrode layer. Therefore, a structure thereof can be simplified and a first mask process thereof can be omitted.

In another aspect, using the first electrode layer as a bridging structure between the second electrode layer and the metal electrode layer allows through-holes in the second passivation layer to have a same depth. Compared to through-holes in the second passivation layer having different depths in current technology, the second passivation layer of the present disclosure can open holes just using one mask process, thereby omitting a second mask process, and meanwhile a processing risk caused by different depths of through-holes in exposure and etching processes can be reduced. Therefore, processing stability and feasibility can be improved, thereby improving product yields.

The metal electrode layer of the present disclosure is directly disposed above the planarization layer. Compared to current technology, the present disclosure can omit a passivation layer between the metal electrode layer and the planarization layer, thereby omitting a third mask process. The passivation layer between the metal electrode layer and the planarization layer in current technology is used to prevent the planarization layer from being damaged when the metal electrode layer is etched. This can be achieved by substituting a material that can be patterned by wet etching, such as laminated metals of Mo/Al/Mo, for a material of the metal electrode layer, and then patterning the metal electrode layer by wet etching. Since the passivation layer between the metal electrode layer and the planarization layer is omitted, a depth of the first via 30a that connects the first electrode 41 of the metal electrode layer to the first drain electrode DE1 of the source and drain electrode metal layer becomes shallower. Therefore, an undercut risk of taper angles when etching can be reduced, thereby improving connecting reliability between the metal electrode layer and the source and drain electrode metal layer. Further, in current technology, it is necessary to form nested holes in the planarization layer and the passivation layer, so an area of holes defined in the planarization layer is larger, thereby reducing the aperture ratio.

Figure 4:
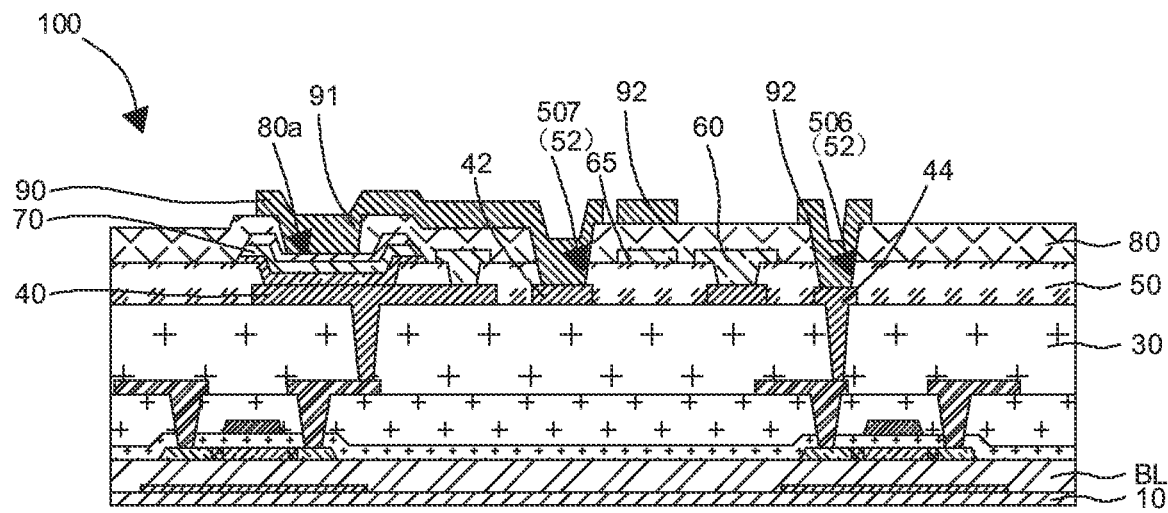
FIG. 4 is a schematic cross-sectional diagram of the array substrate according to another embodiment of the present disclosure.

Referring to FIG. 4, FIG. 4 is a schematic cross-sectional diagram of the array substrate according to another embodiment of the present disclosure. The embodiment of FIG. 4 is basically same as that of FIG. 1, and a difference is that the embodiment of FIG. 4 has a third through-hole 52 in the first passivation layer 50 and the second passivation layer 80. The third through-hole 52 penetrates through the first passivation layer 50 and the second passivation layer 80 and is configured to expose the metal electrode layer 40. The second electrode layer 90 extends into the third through-hole 52 and is electrically connected to the metal electrode layer 40.

Specifically, the part of the pixel electrode 92 is disposed opposite to the common electrode 65 and is configured to cooperate with the common electrode 65 to control the liquid crystals to deflect. The third through-hole 52 includes a seventh sub through-hole 506 and an eighth sub through-hole 507. The seventh sub through-hole 506 is disposed corresponding to the second bridging electrode 44. The another part of the pixel electrode 92 extends into the seventh sub through-hole 506 to be electrically connected to the second bridging electrode 44 and to be further electrically connected to the second transistor T2 by the second bridging electrode 44. The part of the second electrode 91 extends into the second opening 80a to be electrically connected to the photosensitive semiconductor layer 70. The eighth sub through-hole 507 is configured to expose the fingerprint recognition common electrode 42. The another part of the second electrode 91 extends into the eighth sub through-hole 507 to be electrically connected to the fingerprint recognition common electrode 42.

Figure 5:
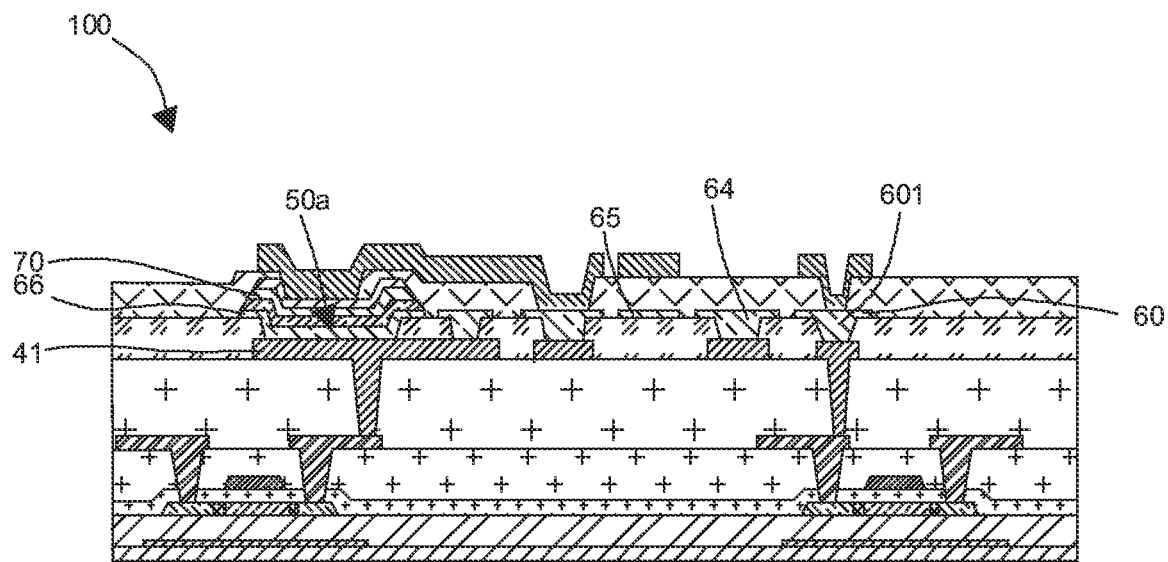
FIG. 5 is a schematic cross-sectional diagram of the array substrate according to yet another embodiment of the present disclosure.

Referring to FIG. 5, FIG. 5 is a schematic cross-sectional diagram of the array substrate according to yet another embodiment of the present disclosure. The embodiment of FIG. 5 is basically same as that of FIG. 1, and a difference is that in the embodiment of FIG. 5, the first electrode layer 60 further includes a middle electrode 66. The middle electrode 66 is disposed in the first opening 50a and electrically connects the first electrode 41 to the photosensitive semiconductor layer 70. The middle electrode 66 is located directly below the photosensitive semiconductor layer 70. A shape of the middle electrode 66 is exactly same as that of the photosensitive semiconductor layer 70. In other words, an orthographic projection of the photosensitive semiconductor layer 70 on a plane that the middle electrode 66 is located overlaps the middle electrode 66. The middle electrode 66 and the photosensitive semiconductor layer 70 are formed by a same mask process. By forming the middle electrode 66 between the photosensitive semiconductor layer 70 and the first electrode 41 and using a same material to manufacture the middle electrode 66, the first bridging electrode 601, the fingerprint recognition capacitor plate 63, the touch control electrode 64, and the common electrode 65, the middle electrode 66 and the photosensitive semiconductor layer 70 can be formed by the same mask process, thereby omitting a fourth mask process for the array substrate of the present disclosure.

In a manufacturing process of the array substrate of the embodiment, the first electrode layer and the photosensitive semiconductor layer may be manufactured in a same process, so the manufacturing process can be simplified, and a mask number needed in the manufacturing process can be reduced.

The present disclosure further provides a manufacturing method of the array substrate.

Figure 6:
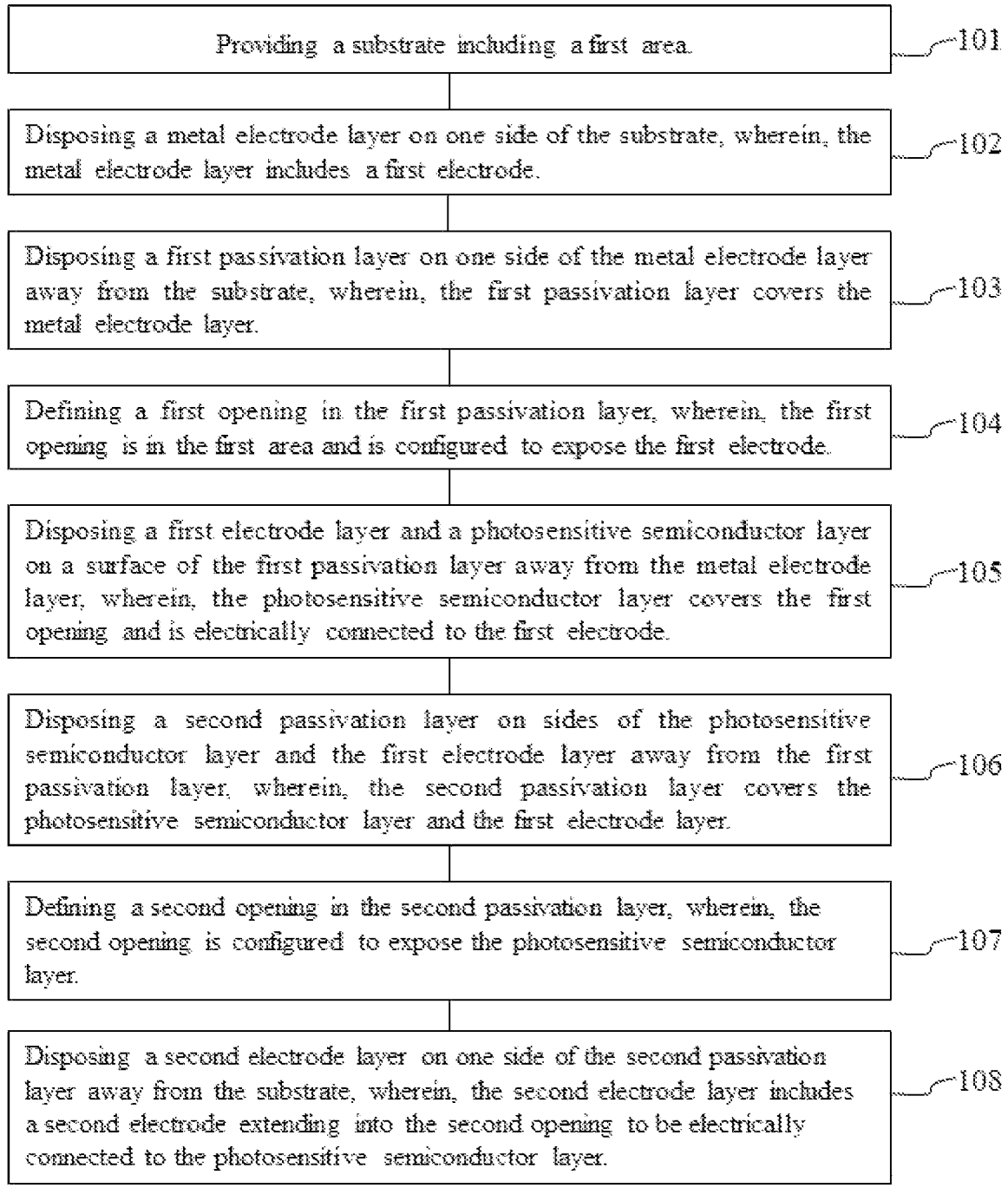
FIG. 6 is a flowchart of a manufacturing method of the array substrate according to an embodiment of the present disclosure.

Referring to FIG. 6, FIG. 6 is a flowchart of the manufacturing method of the array substrate according to an embodiment of the present disclosure.

The manufacturing method of the array substrate provided in the present disclosure includes following steps.

Step 101: providing a substrate including a first area.

Step 102: disposing the metal electrode layer on one side of the substrate, wherein, the metal electrode layer includes the first electrode.

Step 103: disposing the first passivation layer on one side of the metal electrode layer away from the substrate, wherein, the first passivation layer covers the metal electrode layer.

Step 104: defining the first opening in the first passivation layer, wherein, the first opening is in the first area and is configured to expose the first electrode.

In an embodiment, the step 104 further includes: defining the first through-holes in the first passivation layer, wherein, the first through-holes are configured to expose the metal electrode layer.

Step 105: disposing the first electrode layer and the photosensitive semiconductor layer on the surface of the first passivation layer away from the metal electrode layer, wherein, the photosensitive semiconductor layer covers the first opening and is electrically connected to the first electrode.

In an embodiment, the step 105 further includes: forming the first bridging electrode, wherein, the first bridging electrode extends into the first through-holes to be electrically connected to the metal electrode layer.

Step 106: disposing the second passivation layer on the sides of the photosensitive semiconductor layer and the first electrode layer away from the first passivation layer, wherein, the second passivation layer covers the photosensitive semiconductor layer and the first electrode layer.

Step 107: defining the second opening in the second passivation layer, wherein, the second opening is configured to expose the photosensitive semiconductor layer.

In an embodiment, the step 107 further includes: defining the second through-holes in the second passivation layer, wherein, the second through-holes correspond to the first through-holes and are configured to expose the first bridging electrode.

Step 108: disposing the second electrode layer on one side of the second passivation layer away from the substrate, wherein, the second electrode layer includes the second electrode extending into the second opening to be electrically connected to the photosensitive semiconductor layer.

In an embodiment, the second electrode layer extends into the second through-holes to be electrically connected to the first bridging electrode and to be further electrically connected to the metal electrode layer by the first bridging electrode.

Referring to FIGS. 7(a) to 7(m), FIGS. 7(a) to 7(m) are schematic diagrams of the manufacturing method of the array substrate according to an embodiment of the present disclosure.

The manufacturing method of the array substrate provided in the present disclosure specifically includes following steps.

Figure 7A:
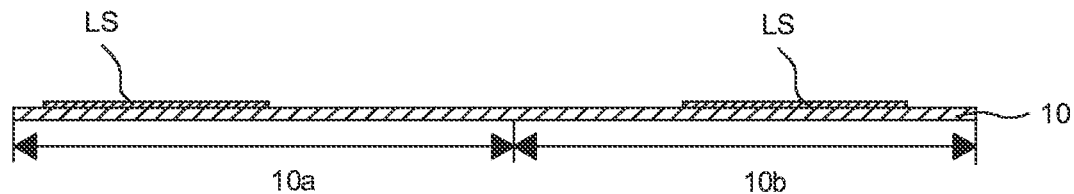
FIGS. 7(a), 7(b), 7(c), 7(d), 7(e), 7(f), 7(g), 7(h), 7(i), 7(j), 7(k), 7(l) and 7(m) are schematic diagrams of the manufacturing method of the array substrate according to an embodiment of the present disclosure.

Step 201: referring to FIG. 7(a), providing the substrate 10. The substrate 10 may be the glass substrate or the plastic substrate. The substrate 10 includes the first area 10a and the second area 10b. The first area 10a and the second area 10b are adjacent to each other. The first area 10a is an area for forming the fingerprint recognition area of the array substrate. The second area 10b is used to form the main display area of the array substrate.

Disposing the light shielding layer LS on the substrate 10. A method of forming the light shielding layer LS includes depositing a light shielding metal layer on the substrate 10 and patterning the light shielding metal layer by exposing, developing, and etching to obtain the light shielding layer LS. A portion of the light shielding layer LS is located in the first area 10a, and another portion thereof is located in the second area 10b.

Figure 7B:
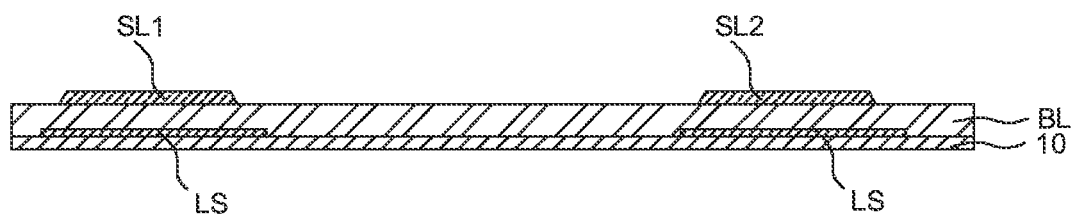

Step 202: referring to FIGS. 7(a) to 7(b), disposing the buffer layer BL on one side of the light shielding layer LS away from the substrate 10. The buffer layer BL covers the light shielding layer LS. Forming a first semiconductor pattern SL1 and a second semiconductor pattern SL2 on one side of the buffer layer BL away from the light shielding layer LS. The first semiconductor pattern SL1 is located in the first area 10a, and the second semiconductor pattern SL2 is located in the second area 10b.

The step of forming the first semiconductor pattern SL1 and the second semiconductor pattern SL2 includes depositing a semiconductor material layer on the side of the buffer layer BL away from the light shielding layer LS and patterning the semiconductor material layer by exposing, developing, and etching to obtain the first semiconductor pattern SL1 and the second semiconductor pattern SL2.

In an embodiment, materials of the first semiconductor pattern SL1 and the second semiconductor pattern SL2 are low temperature polysilicon materials. The first semiconductor pattern SL1 and the second semiconductor pattern SL2 are formed by depositing the amorphous silicon layer on the substrate 10, using excimer laser annealing to transform the amorphous silicon layer into the polysilicon layer, and patterning the polysilicon layer.

Figure 7C:

Step 203: referring to FIG. 7(c), performing a first-time doping on the first semiconductor pattern SL1 and the second semiconductor pattern SL2 using a mask. The first semiconductor pattern SL1 after doping includes an intrinsic semiconductor region SL11 and doped regions SL12. The doped regions SL12 are located on two opposite sides of the intrinsic semiconductor region SL11. A structure of the second semiconductor pattern SL2 after doping is same as that of the first semiconductor pattern SL1, and will not be repeated herein. The phosphorus ions may be used for the first-time doping.

Figure 7D:
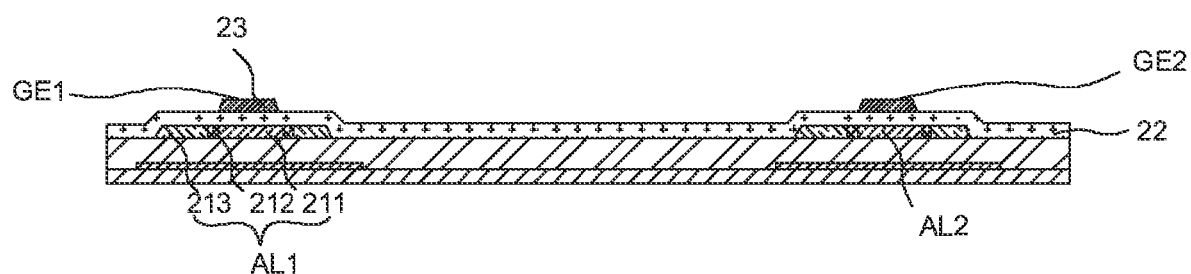

Step 204: referring to FIG. 7(d), disposing the gate insulating layer 22 on one side of the first semiconductor pattern SL1 and the second semiconductor pattern SL2 away from the substrate 10 after the first-time doping. The gate insulating layer 22 covers the semiconductor layer SL after doping. The gate electrode metal layer 23 is disposed on one side of the gate insulating layer 22 away from the substrate 10. The gate electrode metal layer 23 includes the first gate electrode GE1 and the second gate electrode GE2. The first gate electrode GE1 corresponds to the first semiconductor pattern SL1, and the second gate electrode GE2 corresponds to the second semiconductor pattern SL2. The first gate electrode GE1 and the second gate electrode GE2 are used as shielding layers for performing a second-time doping on the first semiconductor pattern SL1 and the second semiconductor pattern SL2 to obtain the first channel part AL1 and the second channel part AL2. Wherein, the first channel part AL1 includes the channel region 211 and the two lightly doped regions 212 located on both sides of the channel region 211. The first channel part AL1 also includes the two heavily doped regions 213. Each of the heavily doped regions 213 is located on one side of the lightly doped regions 212 away from the channel region 211. The lightly doped regions 212 and the heavily doped regions 213 may be N-type doped regions.

Figure 7E:
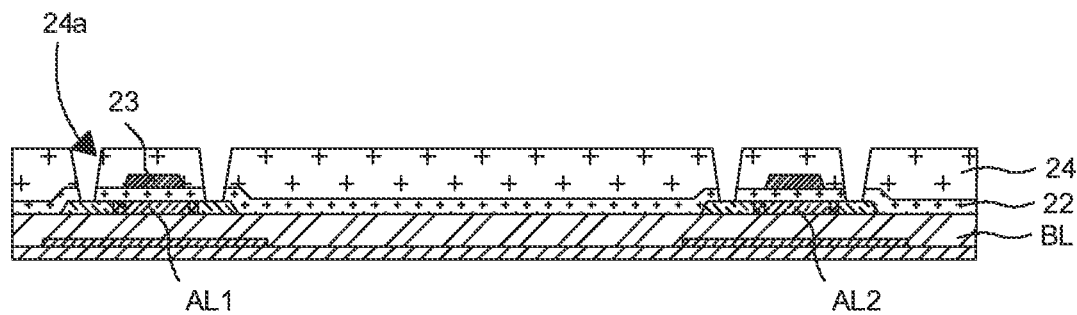
Figure 7F:
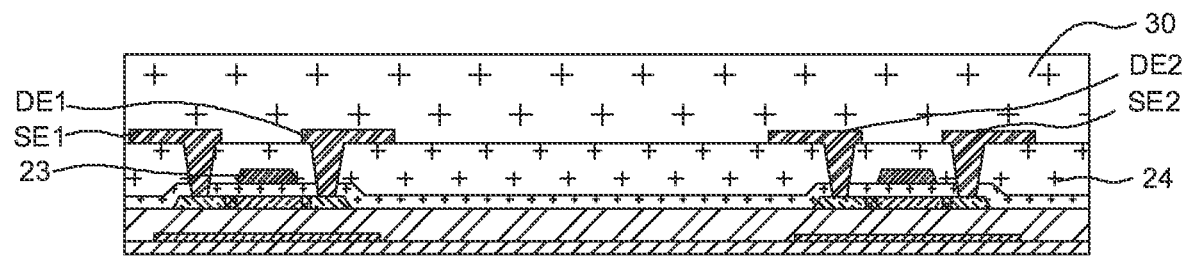
Figure 7G:
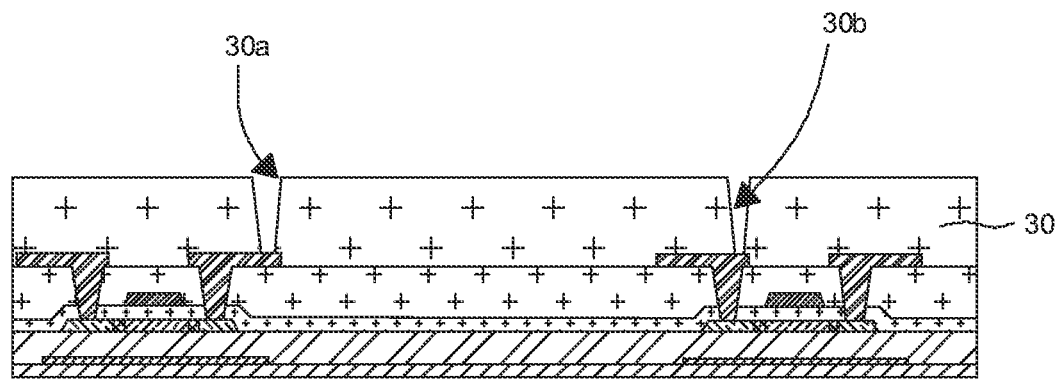
Figure 7H:
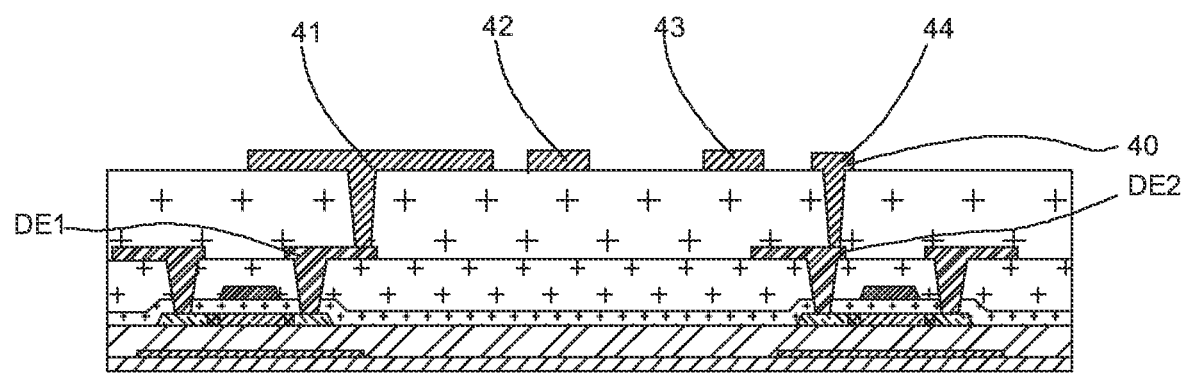
Figure 7I:
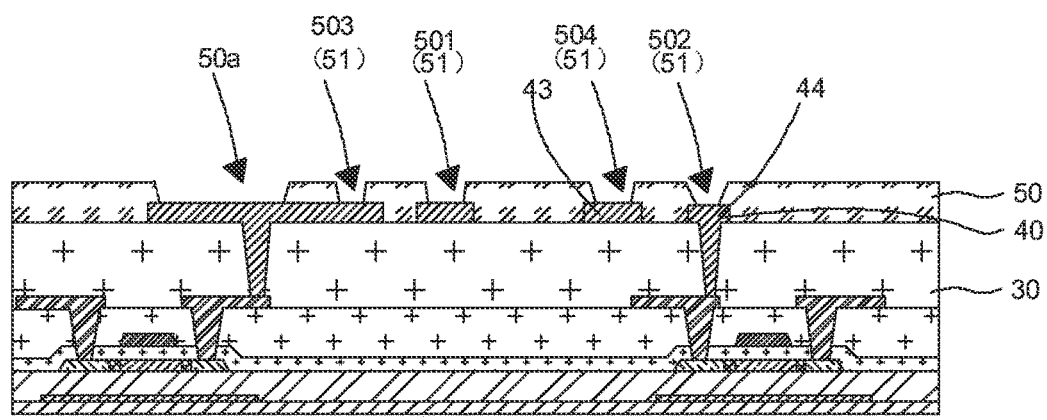
Figure 7J:
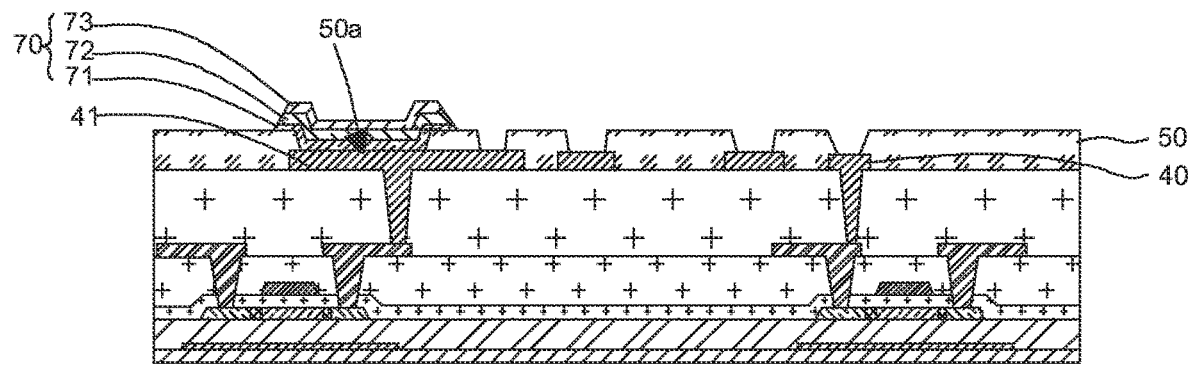
Figure 7K:
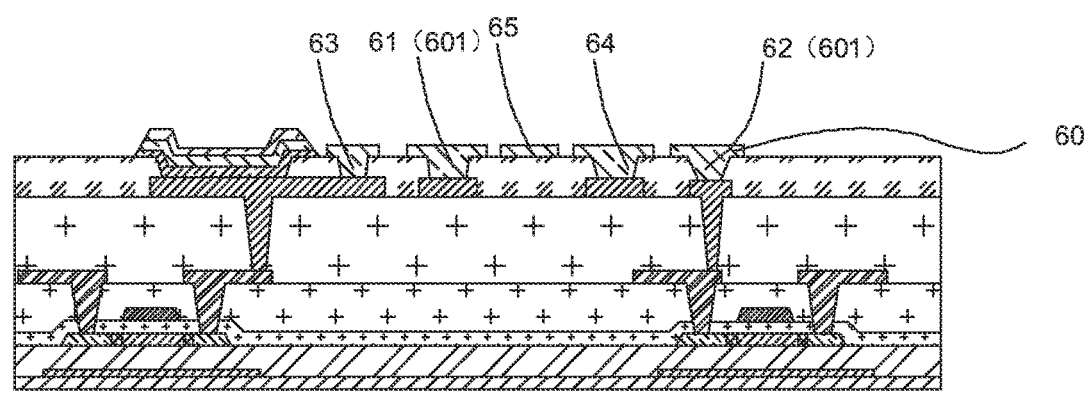
Figure 7L:
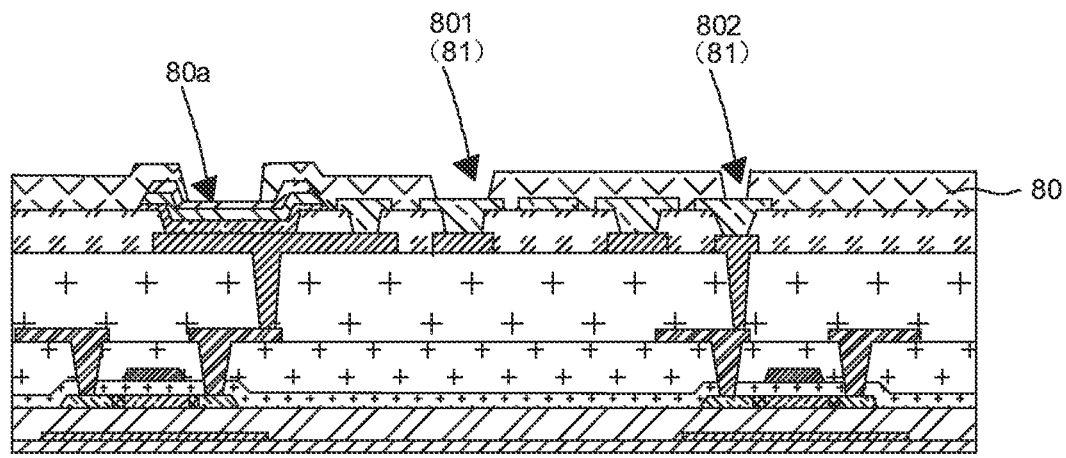
Figure 7M:
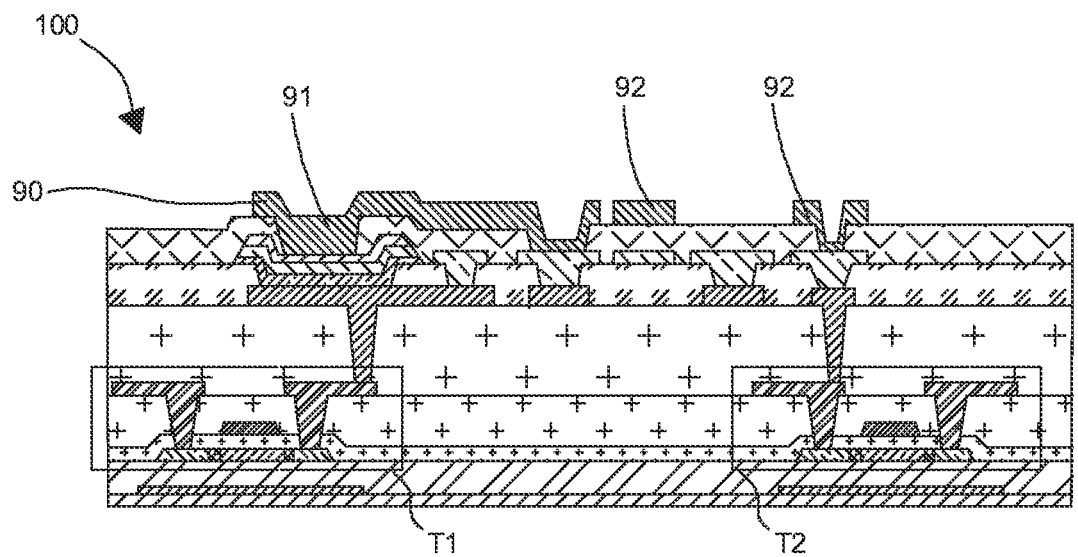

Step 205: referring to FIG. 7(e), disposing the interlayer insulating layer 24 on one side of the first gate electrode GE1 and the second gate electrode GE2 away from the gate insulating layer 22. The interlayer insulating layer 24 covers the gate electrode metal layer 23. The connecting holes 24a are defined in the interlayer insulating layer 24. The connecting holes 24a are located on both sides of the first channel part AL1 and the second channel part AL2.

Step 206: referring to FIGS. 7(*e*) and 7(*f*), forming the first source electrode SE1, the first drain electrode DE1, the second source electrode SE2, and the second drain electrode DE2 on one side of the interlayer insulating layer 24 away from the gate electrode metal layer 23. The first source electrode SE1 and the first drain electrode DE1 are disposed corresponding to both ends of the first channel part AL1 and are connected to the both ends of the first channel part AL1 by the connecting holes 24*a* defined in the interlayer insulating layer 24. The second source electrode SE2 and the second drain electrode DE2 are disposed corresponding to both ends of the second channel part AL2 and are connected to the both ends of the second channel part AL2 by the connecting holes 24*a* defined in the interlayer insulating layer 24.

Disposing the planarization layer 30 on one side of the first source electrode SE1, the first drain electrode DE1, the second source electrode SE2, and the second drain electrode DE2 away from the interlayer insulating layer 24. The planarization layer 30 covers the first source electrode SE1, the first drain electrode DE1, the second source electrode SE2, and the second drain electrode DE2.

Step 207: referring to FIGS. 7(*f*) and 7(*g*), the planarization layer 30 is defined with the plurality of vias. Specifically, the vias include the first via 30*a* and the second via 30*b*. The first via 30*a* is configured to expose the first drain electrode DE1 of the first transistor T1. The second via 30*b* is configured to expose the second drain electrode DE2 of the second transistor T2.

Step 208: referring to FIGS. 7(*a*), 7(*g*), and 7(*h*), disposing the metal electrode layer 40 on one side of the planarization layer 30 away from the first source electrode SE1. The metal electrode layer 40 includes the first electrode 41, the fingerprint recognition common electrode 42, the touch control wiring 43, and the second bridging electrode 44. Wherein, the first electrode 41 and the fingerprint recognition common electrode 42 are disposed in the first area 10*a*. The first electrode 41 is electrically connected to the first drain electrode DE1 of the first transistor T1 by the first via 30*a* defined in the planarization layer 30. The touch control wiring 43 and the second bridging electrode 44 are located in the second area 10*b*. The touch control wiring 43 transmits the signals for the touch control module, and the second bridging electrode 44 is electrically connected to the second drain electrode DE2 of the second transistor T2 by the second via 30*b* defined in the planarization layer 30.

Step 209: referring to FIGS. 7(*h*) and 7(*i*), disposing the first passivation layer 50 on one side of the metal electrode layer 40 away from the planarization layer 30. The first opening 50*a* is defined in the first passivation layer 50, wherein, the first opening 50*a* is in the first area 10*a* and is configured to expose the first electrode 41. The first passivation layer 50 are further defined with the plurality of first through-holes 51 having the consistent depth and formed in the same mask process, and the first through-holes 51 are configured to expose the metal electrode layer 40. Specifically, the first through-holes 51 include the first sub through-hole 501, the third sub through-hole 502, the fifth sub through-hole 503 and the sixth sub through-hole 504. The fifth sub through-hole 503, the first sub through-hole 501, the sixth sub through-hole 504, and the third sub through-hole 502 are arranged in sequence on the side of the metal electrode layer 40 away from the substrate 10. Wherein, the first sub through-hole 501 and the fifth sub through-hole 503 are located in the fingerprint recognition area 100*a*. The first sub through-hole 501 is configured to expose the fingerprint recognition common electrode 42. The fifth sub through-hole 503 is located between the first opening 50*a* and the first sub through-hole 501. The fifth sub through-hole 503 is configured to expose the first electrode 41. The third sub through-hole 502 and the sixth sub through-hole 504 are located in the main display area 100*b*. The third sub through-hole 502 is used to expose the second bridging electrode 44, and the sixth sub through-hole 504 is used to expose the touch control wiring 43.

Step 210: referring to FIGS. 7(*i*) to 7(*j*), disposing the photosensitive semiconductor layer 70 on the surface of the first passivation layer 50 away from the metal electrode layer 40. Wherein, the photosensitive semiconductor layer 70 covers the first opening 50*a* and is electrically connected to the first electrode 41. In an embodiment, the photosensitive semiconductor layer 70 includes the first amorphous silicon layer 71, the second amorphous silicon layer 72, and the third amorphous silicon layer 73 stacked in sequence on the side of the first electrode 41 away from the transistor layer 20. The material of the first amorphous silicon layer 71 includes N-type doped amorphous silicon, the material of the second amorphous silicon layer 72 includes intrinsic amorphous silicon, and the material of the third amorphous silicon layer 73 includes P-type doped amorphous silicon. In another embodiment, the photosensitive semiconductor layer 70 may only include the first amorphous silicon layer 71 and the second amorphous silicon layer 72 disposed in a stack, that is, intrinsic amorphous silicon and P-type doped amorphous silicon.

Step 211: referring to FIGS. 7(*i*) to 7(*k*), disposing the first electrode layer 60 on the surface of the first passivation layer 50 away from the metal electrode layer 40. The first electrode layer 60 includes the first bridging electrode 601, the fingerprint recognition capacitor plate 63, the touch control electrode 64, and the common electrode 65. The first bridging electrode 601 includes the first sub-bridging electrode 61 and the second sub-bridging electrode 62. In this embodiment, the fingerprint recognition capacitor plate 63, the first sub-bridging electrode 61, the common electrode 65, the touch control electrode 64, and the second sub-bridging electrode 62 are arranged in sequence on the surface of the first passivation layer 50 away from the metal electrode layer 40. In the present disclosure, the arrangement thereof is not limited. The first sub-bridging electrode 61 and the fingerprint recognition capacitor plate 63 are located in the first area 10*a*. The first sub-bridging electrode 61 extends into the first sub through-hole 501 to be electrically connected to the fingerprint recognition common electrode 42. The fingerprint recognition capacitor plate 63 is located between the photosensitive semiconductor layer 70 and the first sub-bridging electrode 61, and extends into the fifth sub through-hole 503 to be electrically connected to the first electrode 41. The second sub-bridging electrode 62, the touch control electrode 64, and the common electrode 65 are located in the second area 10*b*. The second sub-bridging electrode 62 extends into the third sub through-hole 502 to be electrically connected to the second bridging electrode 44. The touch control electrode 64 is disposed corresponding to the touch control wiring 43 and extends into the sixth sub-through hole 504 to be electrically connected to the touch control wiring 43. The common electrode 65 is used to apply voltages to the display pixel, thereby controlling the liquid crystals to deflect.

Step 212: referring to FIGS. 7(*i*) to 7(*l*), disposing the second passivation layer 80 on the sides of the photosensitive semiconductor layer 70 and the first electrode layer 60 away from the first passivation layer 50. Wherein, the second passivation layer 80 is defined with the second opening 80*a*, and the second opening 80*a* is configured to expose the photosensitive semiconductor layer 70. The second passivation layer 80 is defined with the plurality of second through-holes 81. The second through-holes 81 correspond to the first through-holes 51, and are used to expose the first bridging electrode 601. Specifically, the second through-holes 81 include the second sub through-hole 801 and the fourth sub through-hole 802. The second sub through-hole 801 corresponds to the first sub through-hole 501 and is configured to expose the first sub-bridging electrode 61. The fourth sub through-hole 802 corresponds to the third sub through-hole 502 and is configured to expose the second sub-bridging electrode 62.

Step 213: referring to FIGS. 7(*h*) to 7(*m*), disposing the second electrode layer 90 on the side of the second passivation layer 80 away from the substrate 10. The second electrode layer 90 extends into the second through-holes 81 to be electrically connected to the first bridging electrode 601 and to be further electrically connected to the metal electrode layer 40 by the first bridging electrode 601. The second electrode layer 90 includes the second electrode 91 and the pixel electrode 92. The pixel electrode 92 is disposed in the second area 10*b*. The part of the pixel electrode 92 is disposed opposite to the common electrode 65 and is configured to cooperate with the common electrode 65 to control the liquid crystals to deflect. The another part of the pixel electrode 92 extends into the fourth sub through-hole 802 to be electrically connected to the second sub-bridging electrode 62 and to be further electrically connected to the second drain electrode DE2 by the second sub-bridging electrode 62 and the second bridging electrode 44. The part of the second electrode 91 extends into the second opening 80*a* to be electrically connected to the photosensitive semiconductor layer 70. The another part of the second electrode 91 extends into the second sub through-hole 801 to be electrically connected to the first sub-bridging electrode 61 and to be further electrically connected to the fingerprint recognition common electrode 42 by the first sub-bridging electrode 61. The second electrode 91 is further opposite to the fingerprint recognition capacitor plate 63. The second electrode 91 and the fingerprint recognition capacitor plate 63 together constitute the fingerprint recognition capacitor.

The manufacturing method of the array substrate of the present disclosure can omit the passivation layer between the first electrode layer and the photosensitive semiconductor layer in current technology by disposing both the first electrode layer and the photosensitive semiconductor layer on the surface of the first passivation layer away from the metal electrode layer. Therefore, the structure thereof can be simplified and the first mask process thereof can be omitted.

In another aspect, using the first electrode layer as the bridging structure between the second electrode layer and the metal electrode layer allows through-holes in the second passivation layer to have the same depth. Compared to through-holes in the second passivation layer having different depths in current technology, the second passivation layer of the present disclosure can open holes just using one mask process, thereby omitting the second mask process, and meanwhile the processing risk caused by different depths of through-holes in exposure and etching processes can be reduced. Therefore, the processing stability and feasibility can be improved, thereby improving the product yields. The metal electrode layer of the present disclosure is directly disposed above the planarization layer. Compared to current technology, the present disclosure can omit the passivation layer between the metal electrode layer and the planarization layer, thereby omitting the third mask process. The passivation layer between the metal electrode layer and the planarization layer in current technology is used to prevent the planarization layer from being damaged when the metal electrode layer is etched. This can be achieved by substituting the material that can be patterned by wet etching, such as laminated metals of Mo/Al/Mo, for the material of the metal electrode layer, and then patterning the metal electrode layer by wet etching. Since the passivation layer between the metal electrode layer and the planarization layer is omitted, the depth of the first via 30*a* that connects the first electrode 41 of the metal electrode layer to the first drain electrode DE1 of the source and drain electrode metal layer becomes shallower. Therefore, the undercut risk of taper angles when etching can be reduced, thereby improving connecting reliability between the metal electrode layer and the source and drain electrode metal layer. Further, in current technology, it is necessary to form nested holes in the planarization layer and the passivation layer, so the area of holes defined in the planarization layer is larger, thereby reducing the aperture ratio.

In another embodiment of the present disclosure, referring to FIG. 4, in the step 212, the first sub-bridging electrode 61 and the second sub-bridging electrode 62 are not formed. In the step 213, the second sub through-hole 801 and the fourth sub through-hole 802 are also not formed. The first passivation layer 50 and the second passivation layer 80 are etched to form the third through-hole 52. The third through-hole 52 penetrates through the first passivation layer 50 and the second passivation layer 80 and is configured to expose the metal electrode layer 40. In the step 214, the second electrode layer 90 extends into the third through-hole 52 and is electrically connected to the metal electrode layer 40.

Specifically, the part of the pixel electrode 92 is disposed opposite to the common electrode 65 and is configured to cooperate with the common electrode 65 to control the liquid crystals to deflect. The third through-hole 52 includes the seventh sub through-hole 506 and the eighth sub through-hole 507. The seventh sub through-hole 506 is disposed corresponding to the second bridging electrode 44. The another part of the pixel electrode 92 extends into the seventh sub through-hole 506 to be electrically connected to the second bridging electrode 44 and to be further electrically connected to the second transistor T2 by the second bridging electrode 44. The part of the second electrode 91 extends into the second opening 80*a* to be electrically connected to the photosensitive semiconductor layer 70. The eighth sub through-hole 507 is configured to expose the fingerprint recognition common electrode 42. The another part of the second electrode 91 extends into the eighth sub through-hole 507 to be electrically connected to the fingerprint recognition common electrode 42.

In an embodiment, the step 105 of disposing the first electrode layer and the photosensitive semiconductor layer on the surface of the first passivation layer away from the metal electrode layer may be finished by the mask process using the grayscale mask or the halftone mask. Wherein, the first electrode layer further includes the middle electrode disposed in the first opening and electrically connecting the first electrode to the photosensitive semiconductor layer.

Specifically, referring to FIGS. 8(a) to 8(e), FIGS. 8(a) to 8(e) are schematic diagrams of steps of disposing the first electrode layer and the photosensitive semiconductor layer on the surface of the first passivation layer away from the metal electrode layer of the manufacturing method of the array substrate according to another embodiment of the present disclosure.

Figure 8A:
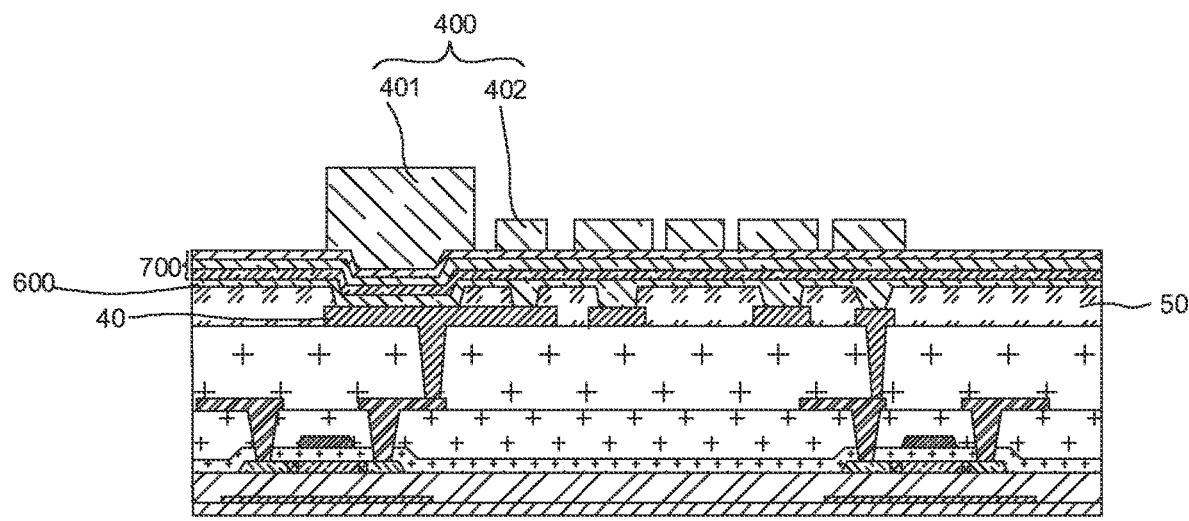
FIGS. 8(a), 8(b), 8(c), 8(d) and 8(e) are schematic diagrams of steps of disposing a first electrode layer and a photosensitive semiconductor layer on one surface of a first passivation layer away from a metal electrode layer of the manufacturing method of the array substrate according to another embodiment of the present disclosure.

Step 301: referring to FIG. 8(a), forming a first electrode material layer 600 and a photosensitive semiconductor material layer 700 on the surface of the first passivation layer 50 away from the metal electrode layer 40 and forming an etching barrier layer 400 on a surface of the first electrode material layer 600 and the photosensitive semiconductor material layer 700 away from the first passivation layer 50. The etching barrier layer 400 is exposed and developed by the grayscale mask or the halftone mask to form a first etching barrier pattern 401 in a first position and a second etching barrier pattern 402 in a second position, wherein, the first position corresponds to the photosensitive semiconductor layer, and the second position corresponds to the metal electrode layer. Wherein, a thickness of the first etching barrier pattern 401 is greater than a thickness of the second etching barrier pattern 402.

Figure 8B:
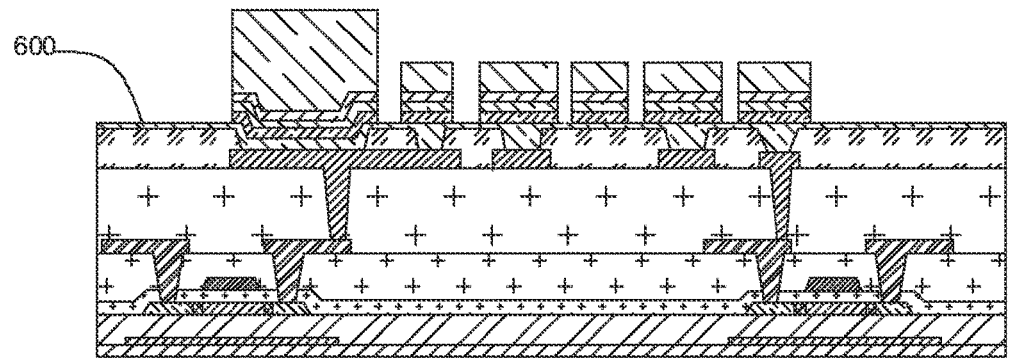

Step 302: referring to FIGS. 8(a) and 8(b), etching to remove the photosensitive semiconductor material layer 700 that is not covered by the first etching barrier pattern 401 and the second etching barrier pattern 402. The etching in this step may use dry etching.

Figure 8C:
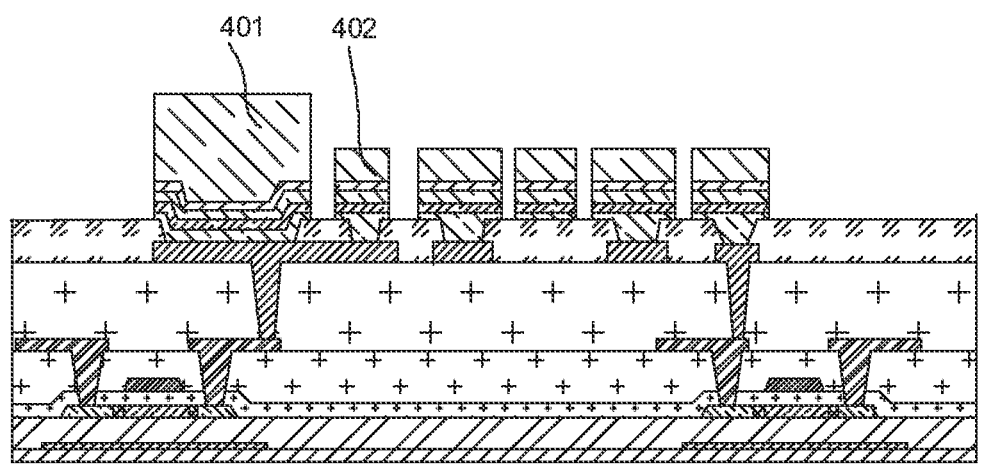

Step 303: referring to FIGS. 8(a) to 8(c), etching to remove the first electrode material layer 600 that is not covered by the first etching barrier pattern 401 and the second etching barrier pattern 402. The etching in this step may use wet etching.

Figure 8D:
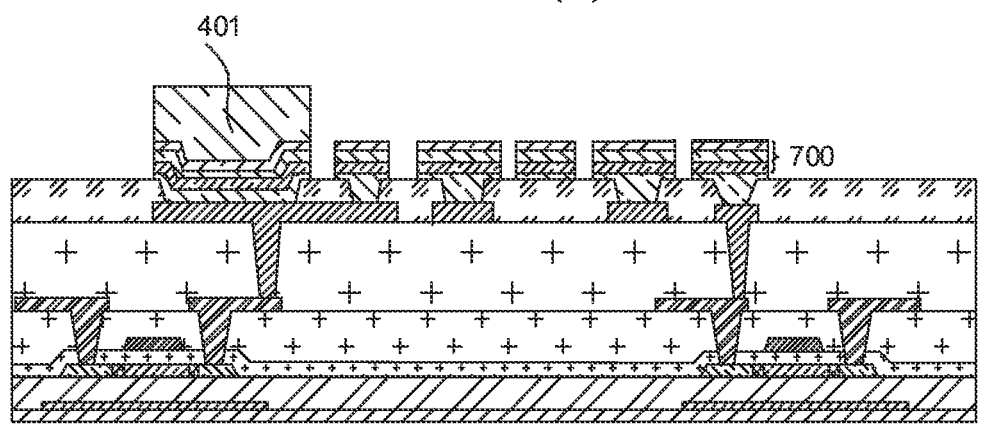

Step 304: referring to FIGS. 8(c) and 8(d), ashing to remove the second etching barrier pattern 402 and retaining the first etching barrier pattern 401. The thickness of the first etching barrier pattern 401 being greater than the thickness of the second etching barrier pattern 402 can control the ashing process, the first etching barrier pattern 401 is retained, and just the thickness of the first etching barrier pattern 401 is reduced.

Figure 8E:
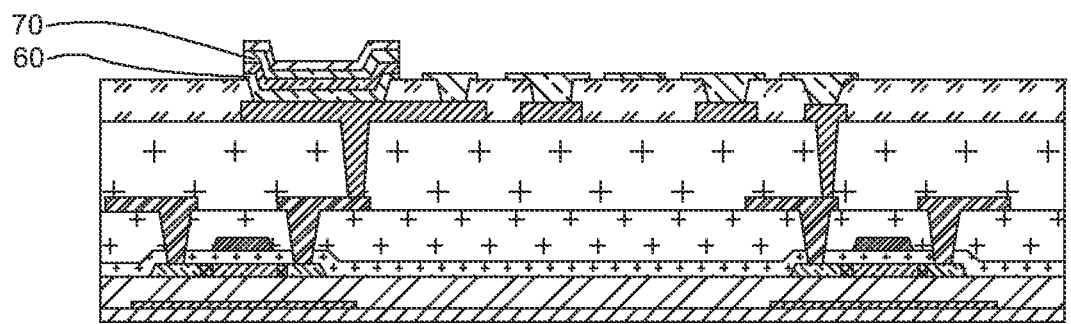

Step 305: referring to FIGS. 5, 8(d), and 8(e), etching to remove the photosensitive semiconductor material layer 700 that is not covered by the first etching barrier pattern 401 and stripping the first etching barrier pattern 401 to obtain the first electrode layer 60 and the photosensitive semiconductor layer 70. Wherein, the first electrode layer 60 further includes the middle electrode 66 disposed in the first opening 50a and electrically connecting the first electrode 41 to the photosensitive semiconductor layer 70. The middle electrode 66 is located directly below the photosensitive semiconductor layer 70. The shape of the middle electrode 66 is exactly the same as that of the photosensitive semiconductor layer 70. In other words, the orthographic projection of the photosensitive semiconductor layer 70 on the plane that the middle electrode 66 is located overlaps the middle electrode 66.

This embodiment can use the grayscale mask or the halftone mask to finish the step of disposing the first electrode layer and the photosensitive semiconductor layer on the surface of the first passivation layer away from the metal electrode layer by one mask process, thereby omitting the fourth mask process for the manufacturing method of the array substrate of the present disclosure.

It can be understood that the steps 201 to 205 of the manufacturing method of the array substrate in this embodiment can replace the steps 208 to 210 of the manufacturing method of the array substrate shown in FIGS. 7(a) to 7(i). Other steps excluding the steps 208 to 210 may use the steps of the manufacturing method of the array substrate shown in FIGS. 7(a) to 7(i), and will not be repeated herein.

In the manufacturing process of the array substrate of the embodiment, the first electrode layer and the photosensitive semiconductor layer may be manufactured in the same process, so the manufacturing process can be simplified, and the mask number needed in the manufacturing process can be reduced. The embodiments of the present disclosure are described in detail above. Specific examples are used herein to explain the principles and implementation of the present disclosure. The descriptions of the above embodiments are only used to help understand the present disclosure. Meanwhile, for those skilled in the art, the range of specific implementation and application may be changed according to the ideas of the present disclosure. In summary, the content of the specification should not be construed as causing limitations to the present disclosure.

What is claimed is:

1. An array substrate, having a fingerprint recognition area and comprising:
    a substrate;
    a metal electrode layer disposed on one side of the substrate and comprising a first electrode;
    a first passivation layer covering one side of the metal electrode layer away from the substrate and defined with a first opening, wherein the first opening is positioned in the fingerprint recognition area and is configured to expose the first electrode;
    a photosensitive semiconductor layer disposed on one surface of the first passivation layer away from the metal electrode layer, covering the first opening, and electrically connected to the first electrode;
    a first electrode layer disposed on one surface of the first passivation layer away from the metal electrode layer;
    a second passivation layer covering sides of the photosensitive semiconductor layer and the first electrode layer away from the first passivation layer and defined with a second opening configured to expose the photosensitive semiconductor layer; and
    a second electrode layer disposed on one side of the second passivation layer away from the substrate and comprising a second electrode, wherein the second electrode extends into the second opening to be electrically connected to the photosensitive semiconductor layer.

2. The array substrate according to claim 1, wherein the first passivation layer is defined with first through-holes configured to expose the metal electrode layer, the first electrode layer comprises a first bridging electrode, and the first bridging electrode extends into the first through-holes to be electrically connected to the metal electrode layer; and the second passivation layer is defined with second through-holes, the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

3. The array substrate according to claim 2, wherein the metal electrode layer comprises a fingerprint recognition common electrode disposed in the fingerprint recognition area and spaced apart from the first electrode;
the first through-holes comprise a first sub through-hole configured to expose the fingerprint recognition common electrode;
the first bridging electrode comprises a first sub-bridging electrode extending into the first sub through-hole to be electrically connected to the fingerprint recognition common electrode; and
the second through-holes comprise a second sub through-hole corresponding to the first sub through-hole and configured to expose the first sub-bridging electrode, and the second electrode extends into the second sub through-hole to be electrically connected to the first sub-bridging electrode and to be further electrically connected to the fingerprint recognition common electrode by the first sub-bridging electrode.

4. The array substrate according to claim 3, comprising a main display area adjacent to the fingerprint recognition area;
the array substrate further comprises a transistor layer disposed between the substrate and the metal electrode layer;
the metal electrode layer comprises a second bridging electrode disposed in the main display area and electrically connected to the transistor layer;
the first through-holes comprise a third sub through-hole defined in the main display area and configured to expose the second bridging electrode;
the first bridging electrode comprises a second sub-bridging electrode extending into the third sub through-hole to be electrically connected to the second bridging electrode;
the second electrode layer comprises a pixel electrode disposed in the main display area; and
the second through-holes comprise a fourth sub through-hole corresponding to the third sub through-hole, and the pixel electrode extends into the fourth sub through-hole to be electrically connected to the second sub-bridging electrode and to be further electrically connected to the second bridging electrode and the transistor layer by the second sub-bridging electrode.

5. The array substrate according to claim 2, wherein the first passivation layer and the second passivation layer are defined with a third through-hole, the third through-hole penetrates through the first passivation layer and the second passivation layer and is configured to expose the metal electrode layer, and the second electrode layer extends into the third through-hole to be electrically connected to the metal electrode layer.

6. The array substrate according to claim 1, wherein the first electrode layer further comprises a middle electrode disposed in the first opening and electrically connecting the first electrode to the photosensitive semiconductor layer, and an orthographic projection of the photosensitive semiconductor layer on a plane that the middle electrode is located overlaps the middle electrode.

7. The array substrate according to claim 1, comprising a main display area adjacent to the fingerprint recognition area; the first electrode layer comprises a display common electrode disposed on the surface of the first passivation layer away from the metal electrode layer and in the main display area; and the second electrode layer comprises a pixel electrode disposed in the main display area and opposite to the display common electrode.

8. The array substrate according to claim 1, further comprising a transistor layer disposed between the substrate and the metal electrode layer, wherein the transistor layer comprises a first transistor disposed in the fingerprint recognition area and electrically connected to the first electrode, and the first electrode, the photosensitive semiconductor layer, and the second electrode correspond to the first transistor.

9. The array substrate according to claim 1, wherein the first electrode layer comprises a fingerprint recognition capacitor plate disposed in the fingerprint recognition area, and the second electrode is opposite to the fingerprint recognition capacitor plate.

10. A manufacturing method of an array substrate, comprising following steps:
providing a substrate comprising a first area;
disposing a metal electrode layer on one side of the substrate, wherein the metal electrode layer comprises a first electrode;
disposing a first passivation layer on one side of the metal electrode layer away from the substrate, wherein the first passivation layer covers the metal electrode layer;
defining a first opening in the first passivation layer, wherein the first opening is in the first area and configured to expose the first electrode;
disposing a first electrode layer and a photosensitive semiconductor layer on one surface of the first passivation layer away from the metal electrode layer, wherein the photosensitive semiconductor layer covers the first opening and is electrically connected to the first electrode;
disposing a second passivation layer on sides of the photosensitive semiconductor layer and the first electrode layer away from the first passivation layer, wherein the second passivation layer covers the photosensitive semiconductor layer and the first electrode layer;
defining a second opening in the second passivation layer, wherein the second opening is configured to expose the photosensitive semiconductor layer; and
disposing a second electrode layer on one side of the second passivation layer away from the substrate, wherein the second electrode layer comprises a second electrode extending into the second opening to be electrically connected to the photosensitive semiconductor layer.

11. The manufacturing method of the array substrate according to claim 10, wherein the step of defining the first opening in the first passivation layer comprises defining first through-holes in the first passivation layer, wherein the first through-holes are configured to expose the metal electrode layer;
the step of disposing the first electrode layer and the photosensitive semiconductor layer on the surface of the first passivation layer away from the metal electrode layer comprises disposing a first bridging electrode, wherein the first bridging electrode extends into the first through-holes to be electrically connected to the metal electrode layer; and
the step of defining the second opening in the second passivation layer comprises defining second through-holes in the second passivation layer, wherein the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

12. The manufacturing method of the array substrate according to claim 10, wherein the step of disposing the first electrode layer and the photosensitive semiconductor layer on the surface of the first passivation layer away from the metal electrode layer is finished by a mask process using a grayscale mask or a halftone mask; and the first electrode layer further comprises a middle electrode disposed in the first opening and electrically connecting the first electrode to the photosensitive semiconductor layer, and an orthographic projection of the photosensitive semiconductor layer on a plane that the middle electrode is located overlaps the middle electrode.

13. A display device, comprising an array substrate having a fingerprint recognition area, wherein the array substrate comprises:
 a substrate;
 a metal electrode layer disposed on one side of the substrate and comprising a first electrode;
 a first passivation layer covering one side of the metal electrode layer away from the substrate and defined with a first opening, wherein the first opening is positioned in the fingerprint recognition area and is configured to expose the first electrode;
 a photosensitive semiconductor layer disposed on one surface of the first passivation layer away from the metal electrode layer, covering the first opening, and electrically connected to the first electrode;
 a first electrode layer disposed on one surface of the first passivation layer away from the metal electrode layer;
 a second passivation layer covering sides of the photosensitive semiconductor layer and the first electrode layer away from the first passivation layer and defined with a second opening configured to expose the photosensitive semiconductor layer; and
 a second electrode layer disposed on one side of the second passivation layer away from the substrate and comprising a second electrode, wherein the second electrode extends into the second opening to be electrically connected to the photosensitive semiconductor layer.

14. The display device according to claim 13, wherein the first passivation layer is defined with first through-holes configured to expose the metal electrode layer, the first electrode layer comprises a first bridging electrode, and the first bridging electrode extends into the first through-holes to be electrically connected to the metal electrode layer; and the second passivation layer is defined with second through-holes, the second through-holes correspond to the first through-holes and are configured to expose the first bridging electrode, and the second electrode layer extends into the second through-holes to be electrically connected to the first bridging electrode and to be further electrically connected to the metal electrode layer by the first bridging electrode.

15. The display device according to claim 14, wherein the metal electrode layer comprises a fingerprint recognition common electrode disposed in the fingerprint recognition area and spaced apart from the first electrode;
 the first through-holes comprise a first sub through-hole configured to expose the fingerprint recognition common electrode;
 the first bridging electrode comprises a first sub-bridging electrode extending into the first sub through-hole to be electrically connected to the fingerprint recognition common electrode; and
 the second through-holes comprise a second sub through-hole corresponding to the first sub through-hole and configured to expose the first sub-bridging electrode, and the second electrode extends into the second sub through-hole to be electrically connected to the first sub-bridging electrode and to be further electrically connected to the fingerprint recognition common electrode by the first sub-bridging electrode.

16. The display device according to claim 14, wherein the first passivation layer and the second passivation layer are defined with a third through-hole, the third through-hole penetrates through the first passivation layer and the second passivation layer and is configured to expose the metal electrode layer, and the second electrode layer extends into the third through-hole to be electrically connected to the metal electrode layer.

17. The display device according to claim 13, wherein the first electrode layer further comprises a middle electrode disposed in the first opening and electrically connecting the first electrode to the photosensitive semiconductor layer, and an orthographic projection of the photosensitive semiconductor layer on a plane that the middle electrode is located overlaps the middle electrode.

18. The display device according to claim 13, wherein the array substrate further comprises a main display area adjacent to the fingerprint recognition area; the first electrode layer comprises a display common electrode disposed on the surface of the first passivation layer away from the metal electrode layer and in the main display area; and the second electrode layer comprises a pixel electrode disposed in the main display area and opposite to the display common electrode.

19. The display device according to claim 13, wherein the array substrate further comprises a transistor layer disposed between the substrate and the metal electrode layer, the transistor layer comprises a first transistor disposed in the fingerprint recognition area and electrically connected to the first electrode, and the first electrode, the photosensitive semiconductor layer, and the second electrode correspond to the first transistor.

20. The display device according to claim 13, wherein the first electrode layer comprises a fingerprint recognition capacitor plate disposed in the fingerprint recognition area, and the second electrode is opposite to the fingerprint recognition capacitor plate.

* * * * *